(12) United States Patent
Nakamura

(10) Patent No.: US 7,267,007 B2
(45) Date of Patent: Sep. 11, 2007

(54) ACCELERATION SENSING DEVICE

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 61 days.

(21) Appl. No.: 11/181,799

(22) Filed: Jul. 15, 2005

(65) Prior Publication Data

US 2006/0042384 A1  Mar. 2, 2006

(30) Foreign Application Priority Data

Sep. 1, 2004 (JP) ............................. 2004-254812

(51) Int. Cl.
*G01P 15/08* (2006.01)

(52) U.S. Cl. ................. 73/514.33; 73/514.01; 73/514.38

(58) Field of Classification Search ............ 73/514.01, 73/514.33, 514.38
See application file for complete search history.

(56) References Cited

U.S. PATENT DOCUMENTS 4,891,984 A * 1/1990 Fujii et al. ............... 73/514.33

6,263,735 B1 * 7/2001 Nakatani et al. ......... 73/514.36
6,925,875 B2 * 8/2005 Silverbrook ................ 73/493

FOREIGN PATENT DOCUMENTS

JP  11-135804  5/1999

* cited by examiner

*Primary Examiner*—John E. Chapman
(74) *Attorney, Agent, or Firm*—Volentine & Whitt, P.L.L.C.

(57) ABSTRACT

An acceleration sensing device includes a movable sensing member, a frame member and a supporting member. The supporting member is coupled between the movable sensing member and the frame member so as to support the movable sensing member. The acceleration sensing device further includes a covering member disposed above the movable sensing member, with a gap between the covering member and the movable sensing member. The acceleration sensing device still further includes internal electrodes, interconnection films, external electrodes and a resin film. The internal electrodes are arranged around the covering member. The interconnection films are disposed on the frame member so as to be coupled to the internal electrodes. The external electrodes are disposed on the interconnection films. The resin film is disposed on the frame member so as to seal the covering member. Also, there is provided a manufacturing method of the acceleration sensing device.

15 Claims, 14 Drawing Sheets

ACCELERATION SENSING DEVICE

BACKGROUND OF THE INVENTION

1. Field of the Invention

The present invention relates to an acceleration sensing device and a manufacturing method of the acceleration sensing device, in particular, to a miniaturized acceleration sensing device and a manufacturing method of the miniaturized acceleration sensing device. This is a counterpart of and claims priority to Japanese Patent Application No. 2004-254812 filed on Sep. 1, 2004, which is herein incorporated by reference.

2. Description of the Related Art

A manufacturing technology for tiny structures having dimensions of several hundred micrometers has been developed by applying a semiconductor fine processing technology. The manufacturing technology is just beginning to be applied to various sensors, optical switching devices in a photonic art and radio-frequency radiation devices. Since the tiny structures such as those devices are manufactured by an established semiconductor manufacturing processes, the tiny structures may be formed on a single chip. The device which includes the above-described tiny structures and systems with specific functions is called a Micro-Electrical-Mechanical-Systems (MEMS) device or a Micro-System-Technology (MIST) device. The MEMS devices include an acceleration sensing device, for example as shown in a Patent Document 1 (Japanese Patent Publication Laid-open No. Hei 11-135804).

The piezo acceleration sensing device described in the Patent Document 1 has a frame member which includes a center part and flexible parts. Each of the flexible parts extends between the center part and a portion of an inside surface of the frame member. The acceleration sensing device also has a sensing member swingably supported by the center part. The acceleration sensing device still also has a support member which supports a lower surface of the frame member and surrounds a periphery of the sensing member through a space. Since the sensing member moves by an external force or an external stress, the sensing member is also called a movable sensing member. The movable sensing member and the flexible parts are integrally configured so as to have the tiny structure. The flexible parts have small thicknesses and narrow widths. The sensing device which has configurations as described above is a packaged device.

FIG. 1A is a schematic top view for describing an acceleration sensing device 100 in the related art. FIG. 1B is a schematic sectional view along a dashed line A-A' of the acceleration sensing device 100 in FIG. 1A. In FIG. 1A, an after-described protective covering member is omitted so that internal configurations of the acceleration sensing device 100 can be shown. The acceleration sensing device 100 has an acceleration sensing chip 110. The acceleration sensing chip 110 has a plurality of electrode pads 112. The acceleration sensing chip 110 outputs signals through the electrode pads 112 or receives input signals through the electrode pads 112. The acceleration sensing chip 110 includes a moving sensing member 114 which mechanically operates. The acceleration sensing chip 110 has a sealing substrate 116 which covers the movable sensing member 114 and limits an operation of the movable sensing member 114. The sealing substrate 116 is mounted on a base substrate 120 through an adhesive film 122. The acceleration sensing device 100 also has the protective covering member 130 which covers the acceleration sensing chip 110 and the sealing substrate 116. The protective covering member 130 is disposed on the base substrate 120 so that a rim of the protective covering member 130 joins the base substrate 120. The protective covering member 130 configures an interspace 140 in which the acceleration sensing chip 110 is disposed. The base substrate 120 has a plurality of external terminals 150 arranged at a periphery of the base substrate 120. The external terminals 150 extend from the interspace 140 toward outside of the protective covering member 130. The electrode pads 112 of the acceleration sensing chip 110 are electrically coupled with the external terminals 150 in the interspace 140 through a plurality of bonding wires 160.

In the above-described acceleration sensing device 100, the acceleration sensing chip 110 and the external terminals 150 are electrically coupled with each other through the bonding wires 160, and furthermore the protective covering member 130 covers not only the acceleration sensing chip 110 but also the bonding wires 160. Therefore, it is difficult to seal the acceleration sensing chip 110 and the bonding wires 160 by transfer molding method or a potting method using liquid resin. As a result, it may be difficult to miniaturize the acceleration sensing device 100. Also, in a manufacturing method of the above-described acceleration sensing device 100, each of the acceleration sensing chips 110 is sealed by the protective covering member 130 after a wafer is diced, to obtain each of the acceleration sensing devices 110. That is, each of the acceleration sensing chips 110 may be sealed with waste materials of the wafer formed during the dicing process adhered to a periphery of the movable sensing member 114. Therefore, the movable sensing member 114 may not operate properly because of the waste materials.

SUMMARY OF THE INVENTION

An object of the present invention is to miniaturize the acceleration sensing device. Another object of the present invention is to improve a yield percentage of the acceleration sensing device.

According to an aspect of the present invention, for achieving the above-mentioned object, there is provided an acceleration sensing device which includes a movable sensing member, a frame member and a supporting member. The movable sensing member includes a principal surface and a first thickness and senses acceleration. The frame member includes a principal surface and a second thickness which is greater than the first thickness of the movable sensing member. The frame member surrounds the movable sensing member. The supporting member is coupled between the movable sensing member and the frame member. The supporting member supports the movable sensing member so that the principal surface of the movable sensing member is coplanar with the principal surface of the frame member. The acceleration sensing device further includes a covering member which is disposed above the movable sensing member, with a gap between the covering member and the movable sensing member. The acceleration sensing device still further includes a plurality of internal electrodes, a plurality of interconnection films, a plurality of external electrodes and a resin film. The internal electrodes are disposed at the principal surface of the frame member and are arranged around the covering member. The interconnection films are disposed on the principal surface of the frame member so as to be coupled to the internal electrodes. The external electrodes are disposed on the interconnection films and electrically coupled to the interconnection films. The resin film is disposed on the principal surface of the frame member so as to seal the covering member, the internal electrodes and the interconnection films.

According to the other aspect of the present invention, for achieving the above-mentioned other object, there is provided a manufacturing method of an acceleration sensing device. In the method, a semiconductor substrate is provided which has a principal surface including a plurality of device regions. Each of the device regions includes a movable sensing member and a plurality of internal electrodes. The internal electrodes are arranged around the movable sensing member. Next, a base substrate is disposed on a rear surface of the semiconductor substrate. Covering members is formed over each of the device regions, so as to cover the movable sensing members. A plurality of interconnection films are formed on each of the device regions so as to be coupled to the internal electrodes. Then, a resin film is formed on the principal surface of the semiconductor substrate so as to cover the covering member, the internal electrodes and a portion of each of the interconnection films in each of the device regions. Thereafter, the semiconductor substrate, the resin film and the base substrate are divided to separate the device regions into a plurality of acceleration sensing devices.

The above and further aspects and novel features of the invention will more fully appear from the following detailed description, appended claims and the accompanying drawings.

DETAILED DESCRIPTION OF THE PREFERRED EMBODIMENTS

Embodiments of the present invention will be described hereinafter with references to the accompanying drawings. The drawings used for this description illustrate major characteristic parts of embodiments in order that the present invention will be easily understood. However, the invention is not limited by these drawings.

Figure 1A:
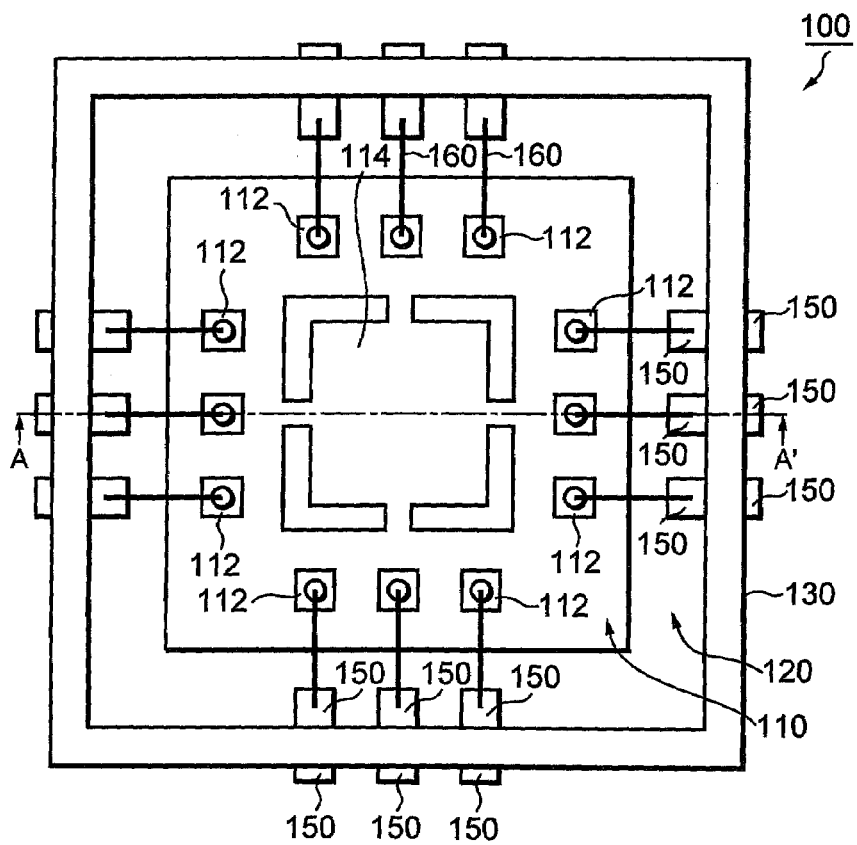
FIG. 1A is a schematic top view for describing an acceleration sensing device in the related art.
Figure 1B:
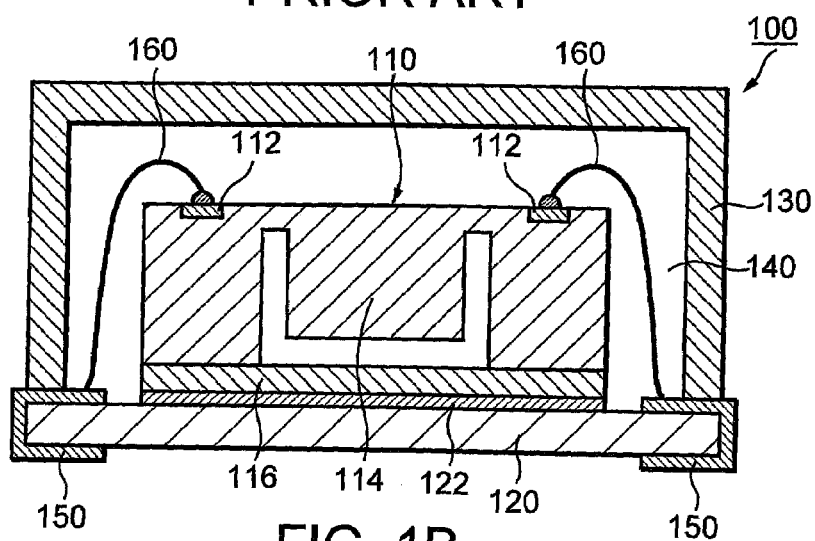
FIG. 1B is a schematic sectional view along a dashed line A-A' of the acceleration sensing device in FIG. 1A.
Figure 2A:
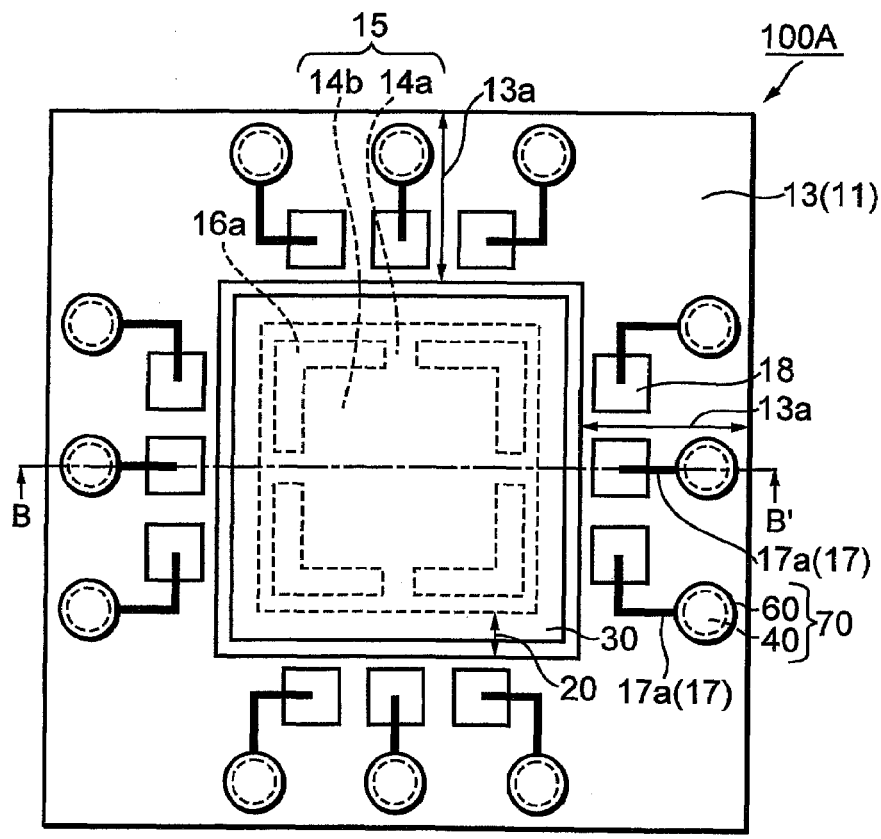
FIG. 2A is a schematic top view for describing an acceleration sensing device according to a first preferred embodiment of the present invention.
Figure 2B:
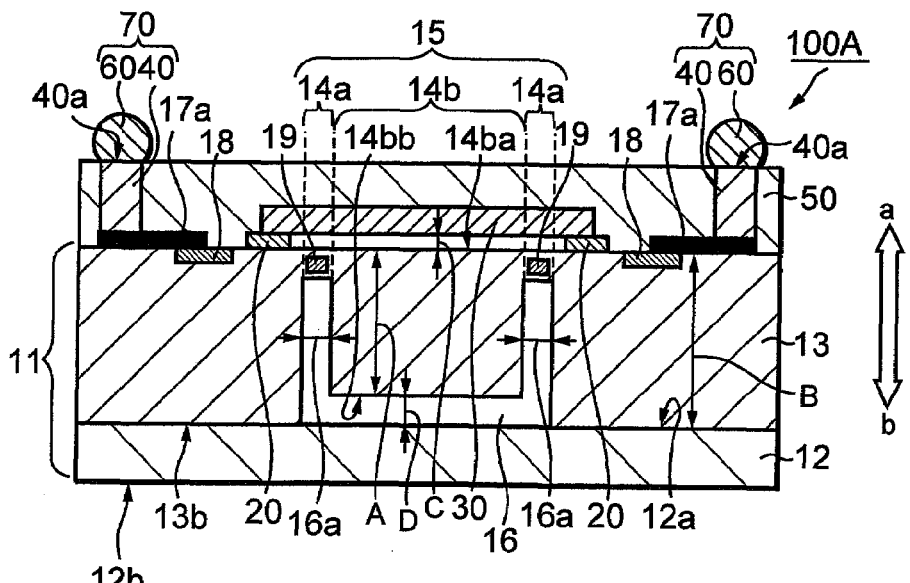
FIG. 2B is a schematic sectional view along a dashed line B-B' of the acceleration sensing device in FIG. 2A.

FIG. 2A is a schematic top view for describing an acceleration sensing device 100A according to a first preferred embodiment of the present invention. In FIG. 1A, an after-described sealing film is omitted so that internal configurations of the acceleration sensing device 100A can be shown. FIG. 2B is a schematic sectional view along a dashed line B-B' of the acceleration sensing device 100A in FIG. 2A. In this example, the acceleration sensing device is a semiconductor device which is capable of measuring sensed acceleration.

The acceleration sensing device 100A includes an acceleration sensing chip 11. The acceleration sensing chip 11 includes a frame member 13 and a movable structure 15. The frame member 13 configures an outline of the acceleration sensing chip 11 and includes a principal surface 13a and a rear surface 13b. In this example, the outline of the acceleration sensing chip 11 is quadrangular. The movable structure 15 includes a plurality of supporting members 14a and a movable sensing member 14b. The supporting members 14a are configured in one with the frame member 13 and the movable sensing member 14b. Each of the supporting members 14a extends between the movable sensing member 14b and an inside surface of the frame member 13. Each of the supporting members 14a has a thin thickness and a narrow width so as to bend when the movable sensing member 14b moves to sense acceleration. The movable sensing member 14b has a principal surface 14ba which is substantially on the same level as an upper surface of the supporting members 14a and the principal surface 13a of the frame member 13. That is, the movable sensing member 14b is supported by the supporting members 14a, so that the principal surface 14ba of the movable sensing member 14b is coplanar with the principal surface 13a of the frame member 13. Furthermore, the movable sensing member 14b has a thickness "A" which is smaller than a thickness "B" of the frame member 13. That is, the movable sensing member 14b is supported in midair by the supporting members 14a. Also, the movable sensing member 14b is positioned away from the inside surface of the frame member 13 by a gap 16a of an opening 16 therebetween. Thus, the movable sensing member 14b can move along a direction indicated by an arrow "a" or "b" shown in FIG. 2B without contacting the frame member 13, in order to sense the acceleration. In this example, the movable sensing member 14b is supported from four different sides by the four supporting members 14a. Alternatively, the movable sensing member 14b may be supported from only one side by one supporting member. Also, in this example, the movable sensing member 14b is cuboid. That is, the movable sensing member 14b has a quadrangle shape which is configured by four sides. The movable sensing member 14b is coupled to each of the supporting members 14a at a center portion of each of the four sides. In addition, the shape of the movable sensing member 14b depends on an envisioned acceleration and sensing conditions.

Each of the supporting members 14a internally includes a detecting element 19 which detects an amount of displacement of the movable structure 15. The number of the detecting elements 19 depends on design of the acceleration sensing device. Each of the detecting elements 19 is coupled to a wiring through which a detected signal by the detecting element 19 is transmitted or through which the detecting element 19 receives an input signal. The wiring includes aluminum. In this example, the detecting element 19 is a piezoresistance element. Also, a detecting element 19 which has applicability to a capacitance type acceleration sensing device may be used.

The acceleration sensing device 100A includes a covering member disposed on the frame member 13 so that the movable structure 15 is covered by the covering member. The covering member includes a supporting frame member 20 and a veiling member 30. The supporting frame member 20 is disposed on the principal surface 13a of the frame member 13 through adhesive material so as to surround the movable structure 15 and the opening 16. The supporting frame member 20 has a closed rectangular structure and includes copper. The supporting frame member 20 has an outer wall and an inner wall which are rectangular. In this example, the supporting frame member 20 is configured so that the inner wall and the outer wall of the supporting frame member 20 are along a periphery of the movable sensing member 14b. The veiling member 30 is disposed on the supporting frame member 20 so as to be positioned away from the principal surface 14ba of the movable sensing member 14b. That is, the supporting members 14a and the movable sensing member 14b are covered by the veiling member 30 at a side of the principal surface of 14ba of the movable sensing member 14b. The veiling member 30 may include one of silicon, silicon oxide and metallic material such as copper. Also, the veiling member 30 may be a flat plate member. The veiling member 30 not only covers the movable structure 15 but also limits the movement of the movable structure 15 along the direction indicated by the arrow "a." That is, a clearance "C" between the principal surface 14ba of the movable sensing member 14b and the veiling member 30 has to be determined so that the veiling member 30 does not prevent the movement of the movable sensing member 14b in a measuring range of the envisioned acceleration. Therefore, the supporting frame member 20 needs to have a thickness which is equal to or larger than the clearance "C." An outline of the veiling member 30 may be determined so as not to prevent after-described internal electrodes 18, interconnection films 17 and external electrodes 70 from being formed on the principal surface 13a of the frame member 13. The outline of the veiling member 30 may be larger than the inner wall of the supporting frame member 20, and furthermore may be larger than the outer wall of the supporting frame member 20.

The acceleration sensing device 100A includes a plurality of the internal electrodes 18, a plurality of the interconnection films 17, a sealing film 50 and a plurality of the external electrodes 70 disposed at the principal surface 13a of the frame member 13 and outside the supporting frame member 20. In general, the acceleration sensing device 100A has a passivation film which covers the principal surface 13a of the frame member 13. The passivation film is an insulating film. The internal electrodes 18 are arranged around the covering member being exposed from the passivation film. The internal electrodes 18 are electrically coupled to the detecting elements 19 in the supporting members 14a. The internal electrodes 18 receive signals based on the acceleration sensed by the movable sensing member 14b. The interconnection films 17 are disposed on the principal surface 13a of the frame member 13 so as to be electrically coupled to the internal electrodes 18. The interconnection films 17 extend from the internal electrodes 18 toward a periphery of the frame member 13. The interconnection films 17 may include copper. The external electrodes 70 are respectively disposed on the interconnection films 17. The external electrodes 70 include a plurality of conductive post members 40 and a plurality of solder bumps 60 disposed on top surfaces 40a of the conductive post members 40. The conductive post members 40 are electrically coupled to the interconnection films 17. The solder bumps 60 are electrically coupled to the conductive post members 40. The solder bumps 60 may be lead-free solder balls. Also, the external electrodes 70 are applicable to the acceleration sensing device 100A without the solder bumps 60, depending on variations of a mounting board on which the acceleration sensing device 100A is mounted. For example, when the conductive post members 40 are made of copper, nickel films may be disposed on the top surfaces and furthermore aurous films may be disposed on the nickel films. The nickel films and the aurous films constitute land-shaped electrodes. Alternatively, soldering paste applied to the top surfaces 40a of the conductive post members 40 may be used as land-shaped electrodes. The sealing film 50 is disposed on the principal surface 13a of the frame member 13 so as to seal the supporting frame member 20, the veiling member 30, the interconnection films 17 and the internal electrodes 18. In this example, a portion of each of the external electrodes 70, that is, each of the solder bumps 60 is exposed from the sealing film 50, and the conductive post members 40 are covered by the sealing film 50.

Furthermore, the acceleration sensing device 100A has a sealing substrate 12 which is attached to the rear surface 13b of the frame member 13. The sealing substrate 12 has an upper surface 12a and a lower surface 12b which is opposite to the upper surface 12a. The sealing substrate 12 is attached to the frame member 13 so that the rear surface 13b of the frame member 13 faces the upper surface 12a of the sealing substrate 12. Thus, the movable sensing member 14b is covered by the sealing substrate 12. In this example, the sealing substrate 12 is a glass substrate. The sealing substrate 12 not only covers the movable structure 15 but also limits the movement of the movable structure 15 along the direction indicated by the arrow "b". That is, the sealing substrate 12 is positioned away from a bottom surface 14bb of the movable sensing member 14b with a clearance "D" between, and the clearance "D" may be determined so that the sealing substrate 12 does not prevent the movement of the movable sensing member 14b in the measuring range of the envisioned acceleration.

As described above, the acceleration sensing device 100A includes the covering member disposed on the principal surface 13a of the frame member 13 so that the movable sensing member 14b is covered by the covering member. Furthermore, the external electrodes 70 are electrically coupled to the internal electrodes 18 through the interconnection films 17 disposed on the principal surface 13a of the frame member 13, and the sealing film 50 is disposed on the principal surface 13a of the frame member 13 so as to seal the covering member, the interconnection films 17 and the internal electrodes 18. That is, the acceleration sensing device 10 is protected by the sealing film 50 without the bonding wires as described in the related art. Therefore, the acceleration sensing device 100A may be miniaturized. Also, since the movable sensing member 14b is covered by the veiling member 30 of the covering member, the thickness of the acceleration sensing device 100A may be reduced.

The operation of the above-described acceleration sensing device 100A is described below. When the acceleration sensing device 100A senses the acceleration, the movable sensing member 14b is displaced along the direction indicated by the arrow "a" or "b". At this time, the supporting members 14a which support the movable sensing member 14b are bent in accordance with the amounts of the displacement of the movable sensing member 14b. The amounts of the displacement are detected as variations of electrical resistance values, by the detecting elements 19 in the supporting members 14a. The detected variations of the electrical resistance values are transmitted to an external measurement circuit through the internal electrodes 18, the interconnection films 17 and the external electrodes 70. As a result, the acceleration which is sensed by the movable sensing member 14b is quantitatively calculated.

Figure 3A:
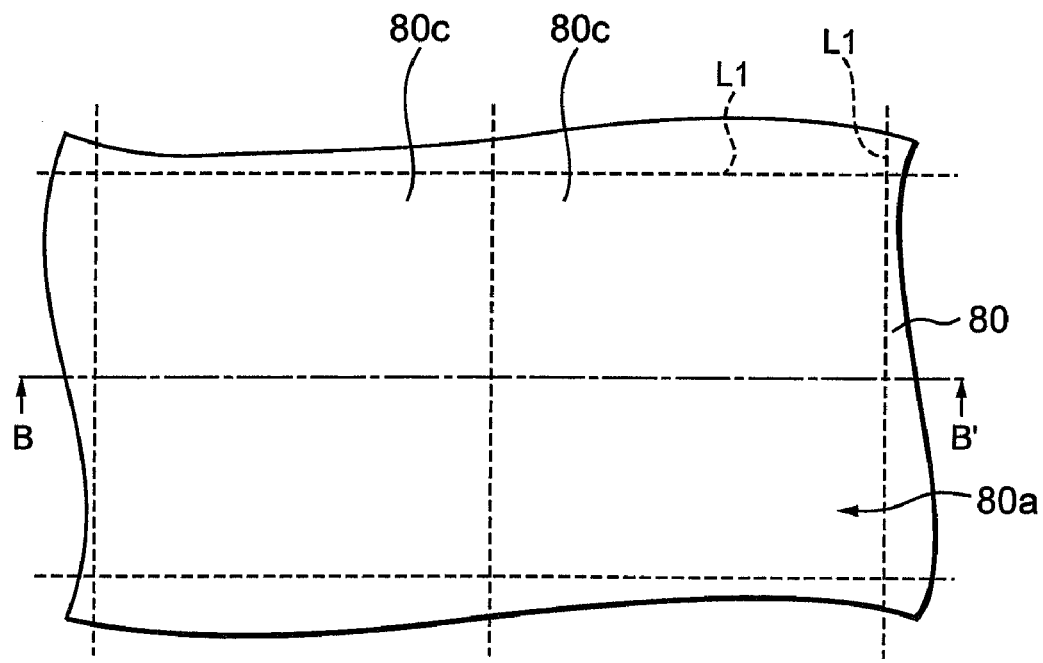
FIGS. 3A, 4A, . . . 7A and 8A are schematic top views for describing processes of manufacturing the acceleration sensing device according to the first preferred embodiment of the present invention.
Figure 3B:
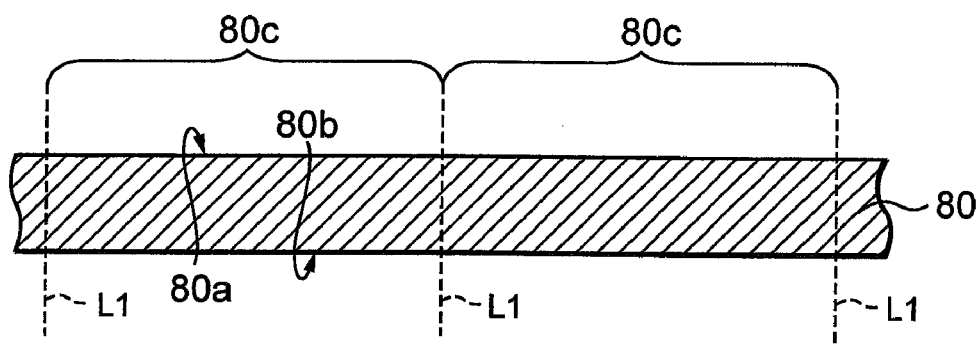
FIGS. 3B, 4B, . . . , 8B and 9 are schematic sectional views for describing processes of manufacturing the acceleration sensing device according to the first preferred embodiment of the present invention.
Figure 4A:
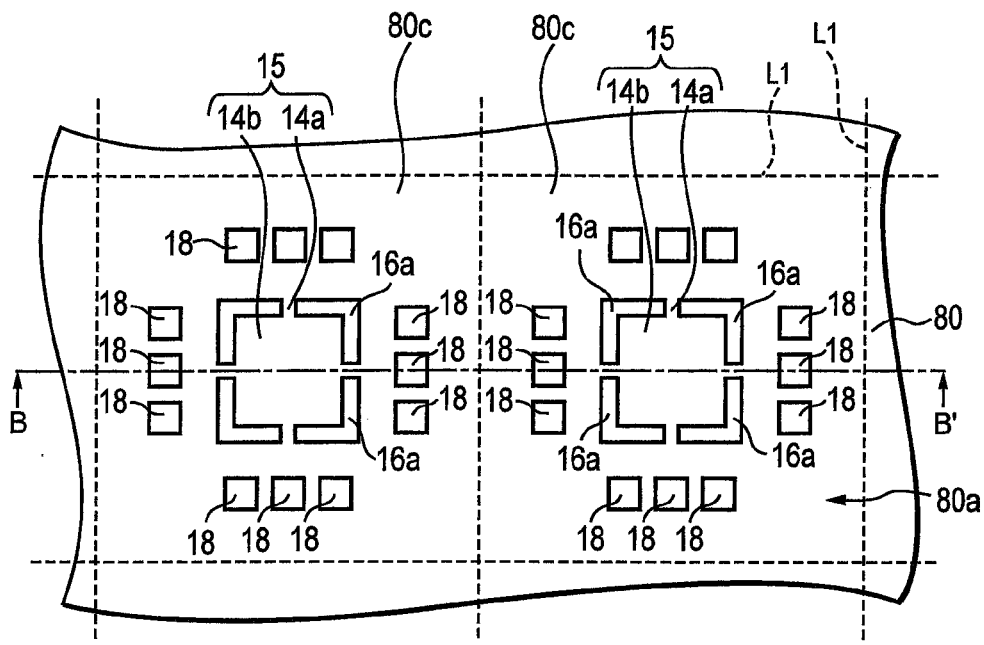
Figure 4B:
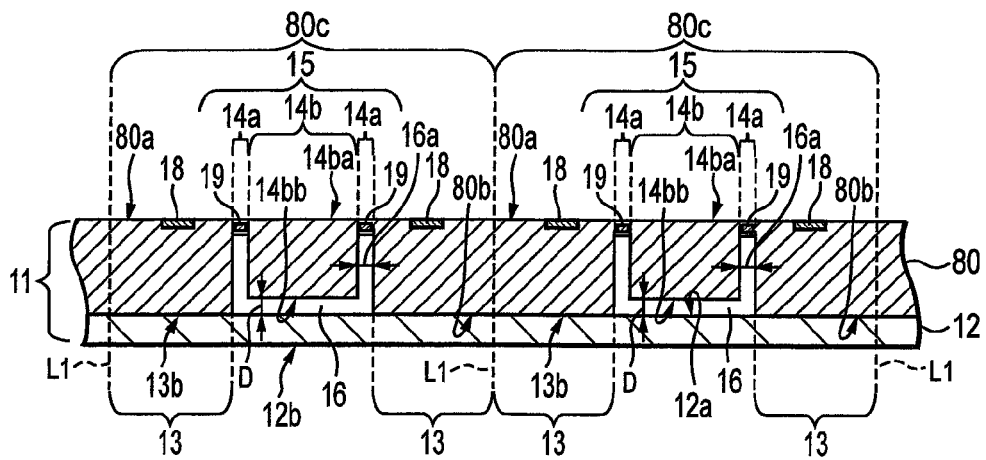

Next, the manufacturing method of the above-described acceleration sensing device 100A is described below. FIGS. 3A, 4A, . . . 7A and 8A are schematic top views for describing processes of manufacturing the acceleration sensing device 100A according to the first preferred embodiment of the present invention. FIGS. 3B, 4B, . . . 8B and 9 are schematic sectional views for describing processes of manufacturing the acceleration sensing device 100A according to the first preferred embodiment of the present invention. Each of FIGS. 3B, 4B, . . . 7B and 8B is the schematic sectional view along a dashed line B-B' in each of FIGS. 3A, 4A, . . . 7A and 8A.

First of all, a semiconductor substrate 80 such as a silicon wafer is provided which includes a principal surface 80a and a rear surface 80b opposite to the principal surface 80a as shown in FIGS. 3A and 3B. The principal surface 80a includes a plurality of device regions 80c. The device regions 80c are afterward used as a plurality of the acceleration sensing chips 11. Each of the device regions 80c is defined by lines L1 to be cut. Next, as shown in FIGS. 4A and 4B, the openings 16 are formed in the semiconductor substrate 80 by photolithography and etching methods in order to respectively configure the frame member 13 and the movable structures 15 in one in the device regions 80c. The openings 16 are formed so that the thickness "A" of the movable sensing member 14b is smaller than the thickness "B" of the frame member 13. Each of the movable structures 15 includes a plurality of the supporting members 14a and the movable sensing member 14b which assumes a constitutive function. Then, the above-described detecting elements 19 and the wirings electrically coupled to each other are formed in the supporting members 14a during a wafer process. The wirings are made of aluminum and formed so as to extend from the supporting members 14a toward the frame member 13. The internal electrodes 18 are formed in each of the device regions 80c so as to be arranged around the movable sensing member 14b as shown in FIG. 4A. The internal electrodes 18 are formed also so as to be coupled to the wirings. The passivation film such as the insulating film is formed on the principal surface 80a of the semiconductor substrate 80 so as to cover the wirings and to expose the internal electrodes 18. Then, the sealing substrate 12 is attached onto the rear surface 80b of the semiconductor substrate 80 by an adhesive layer, so that the bottom surfaces 14bb of the movable sensing members 14b are covered by the sealing substrate 12 with the clearance "D" between, as shown in FIG. 4B.

Figure 5A:
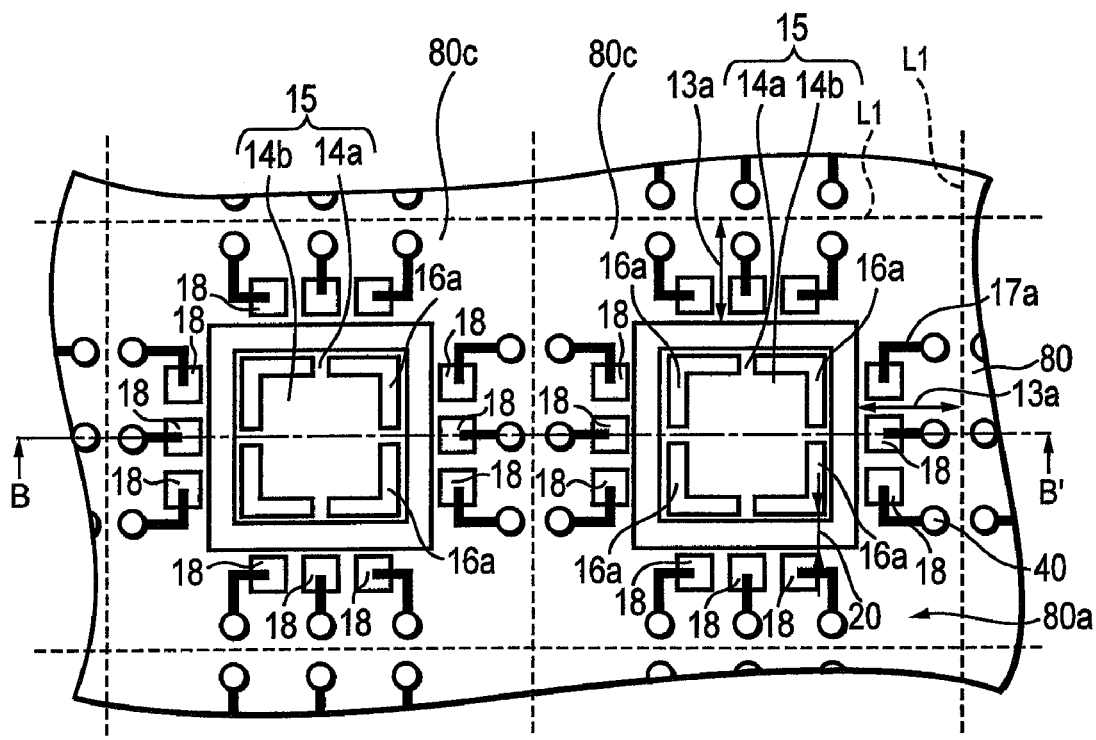
Figure 5B:
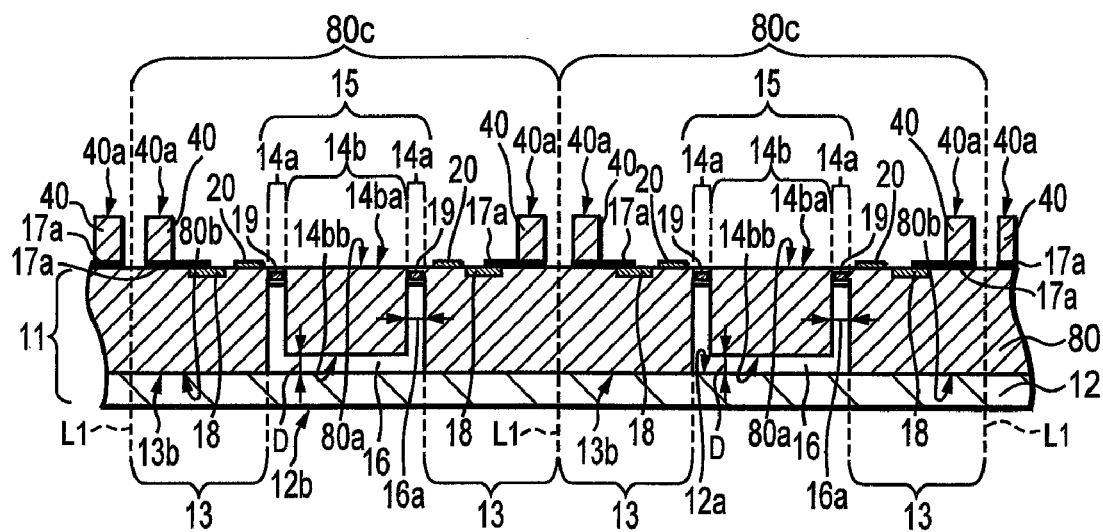
Figure 6A:
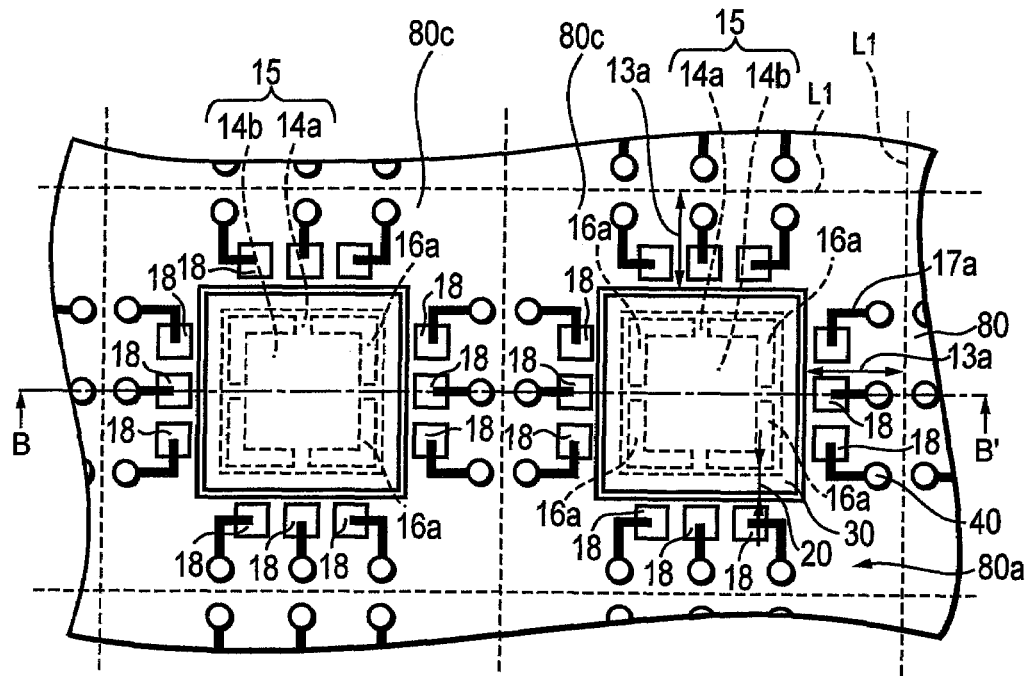
Figure 6B:
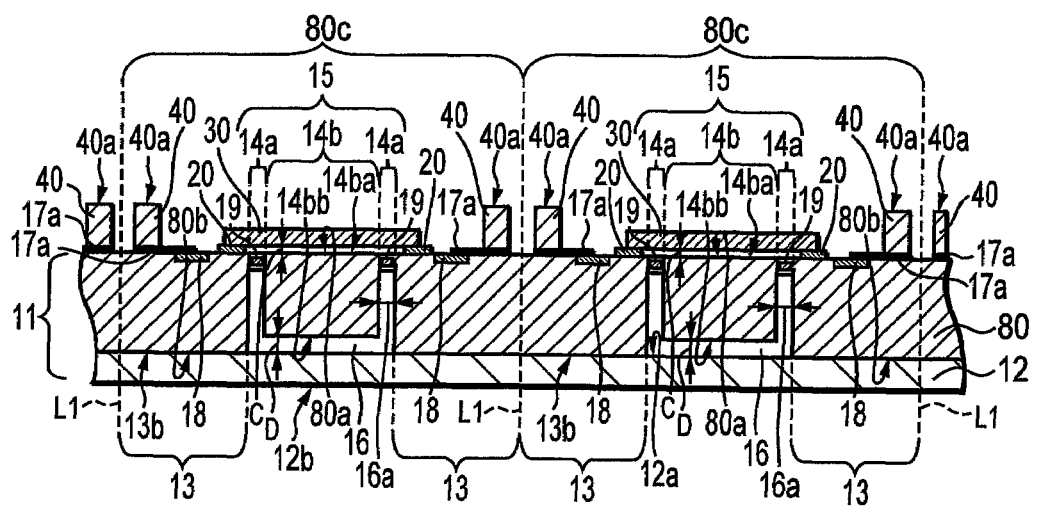

Next, as shown in FIGS. 5A and 5B, a plurality of the interconnection films 17 are formed in each of the device regions 80c of the semiconductor substrate 80 so as to extend from the internal electrodes 18 toward a periphery of the device region 80c. After a metallic layer such as a copper film is formed outside the openings 16 in the device regions 80c, the metallic film is patterned by the photolithography and etching methods in order to form the interconnection films 17. Then, the conductive post members 40 are formed on the interconnection films 17 as shown in FIGS. 5A and 5B. The conductive post members 40 may be formed by plating the principal surface 80a by a conductive layer such as a copper layer, after a patterned resist mask is formed on the principal surface 80a of the semiconductor substrate 80 by the photolithography and etching methods. In addition, the resist mask may include a resist for dry developing. Also, in this example, the conductive post members 40 may be columnar. Then, the supporting frame members 20 are formed on the principal surface 80a of the semiconductor substrate 80 so that each of the movable structures 15 is surrounded by each of the supporting frame members 20. In addition, the supporting frame members 20 may be simultaneously formed together with the interconnection films 17. Thereafter, the veiling members 30 are formed on the supporting frame members 20 so that each of the movable structures 15 is covered by each of the veiling members 30 as shown in FIGS. 6A and 6B. That is, the movable structures 15 are respectively covered by the covering members which are respectively configured by the supporting frame members 20 and the veiling members 30.

Figure 7A:
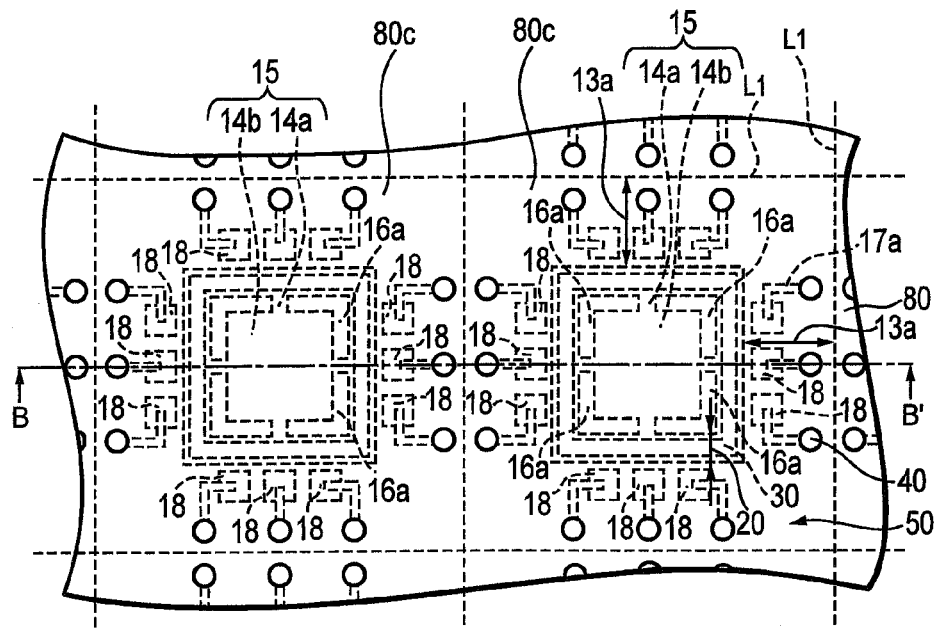
Figure 7B:
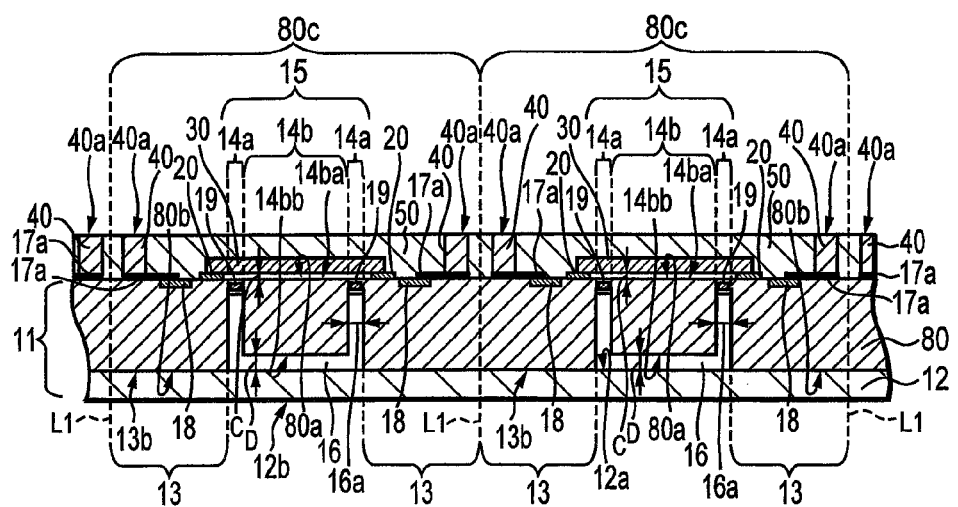

After each of the movable structures 15 is covered by the covering member, the sealing film 50 is formed on the principal surface 80a of the semiconductor substrate 80 so as to cover the covering member, the interconnection films 17, the internal electrodes 18 and a portion of each of the conductive post members 40, as shown in FIGS. 7A and 7B. That is, the sealing film 50 is formed so that top surfaces 40a of the conductive post members 40 are exposed from the sealing film 50. The sealing film 50 may be made of epoxy resin and formed by a transfer molding method or a printed method. On such an occasion as this, after the sealing film 50 is formed so as to cover the top surfaces 40a of the conductive post members 40, the sealing film 50 may be removed so that the top surfaces 40a of the conductive post members 40 are exposed from the sealing film 50. Alternatively, the sealing film 50 may be formed so as to expose the top surfaces 40a of the conductive post members 40 from the beginning. When the conductive post members 40 include the copper, thin nickel films may be formed on the top surfaces 40a of the conductive post members 40 as barrier metallic films.

Figure 8A:
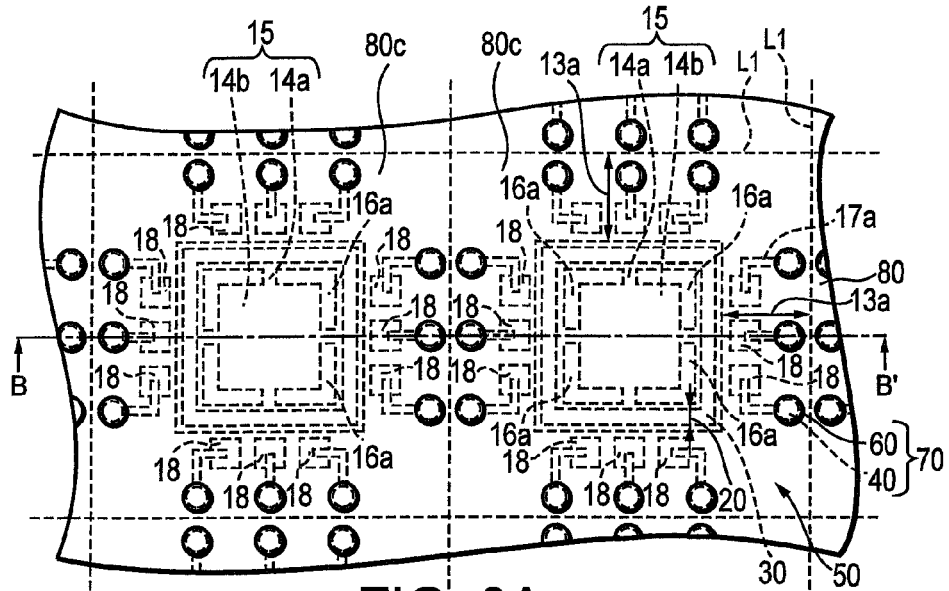
Figure 8B:
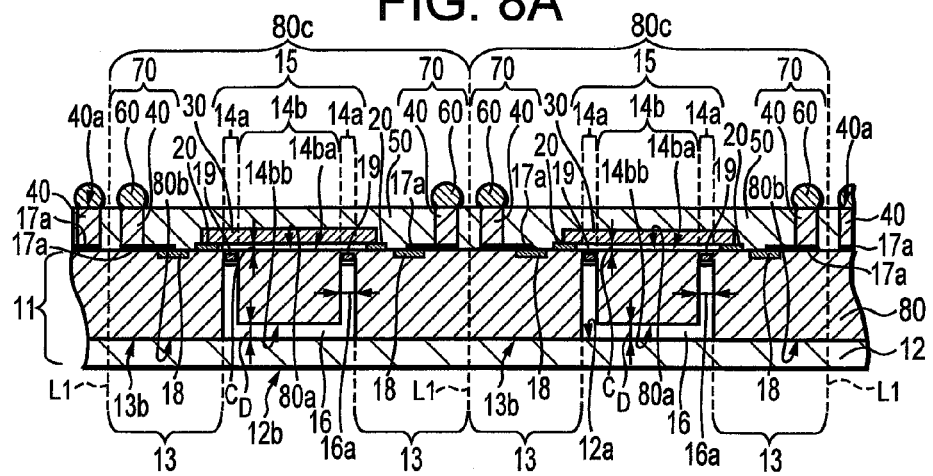
Figure 9:
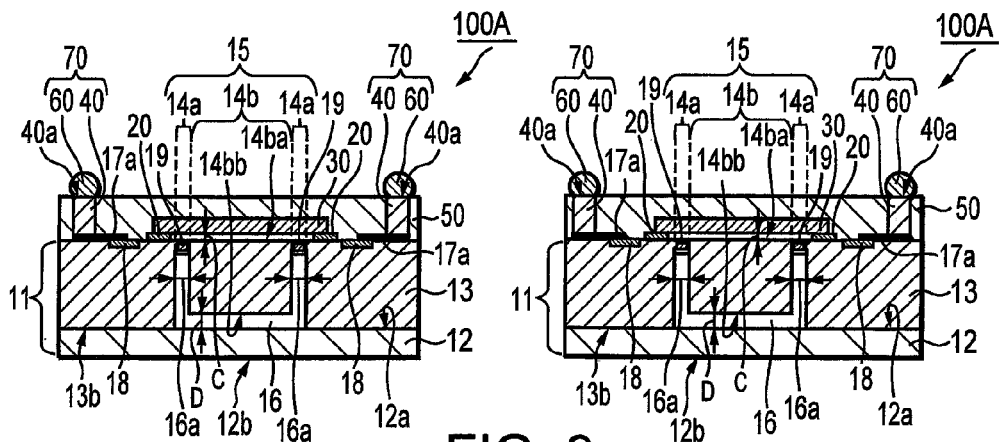

Thereafter, a plurality of the solder bumps 60 are formed on the top surfaces 40a of the conductive post members 40 as shown in FIGS. 8A and 8B. The conductive post members 40 and the solder bumps 60 configure the external electrodes 70. Alternatively, portions of each of the interconnection films 17 may be exposed from the sealing film 50 without the external electrodes 70. Then, as shown in FIG. 9, the sealing substrate 12 and the semiconductor substrate 80 covered by the sealing film 50 are divided into a plurality of the acceleration sensing devices along the lines L1, using a dicing apparatus. That is, the semiconductor substrate 80 is divided in accordance with each of the device regions 80c.

According to the first preferred embodiment, the movable sensing member is covered by the covering member which is formed on the frame member. Furthermore, the interconnection films which are coupled between the internal electrodes and the external electrodes are disposed on the frame member and are sealed by the sealing film. That is, the external electrodes are electrically coupled to the internal electrodes without the bonding wires as described in the related art. Therefore, the acceleration sensing device may be miniaturized. Also, after the semiconductor substrate in which the movable structures have been formed is sealed by the sealing film, the semiconductor substrate is divided into a plurality of the acceleration sensing devices. Therefore, waste materials of the semiconductor substrate, which are formed during the dicing process, may be suppressed from adhering to the movable sensing members. As a result, the yield percentage of the acceleration sensing devices may be improved.

Figure 10A:
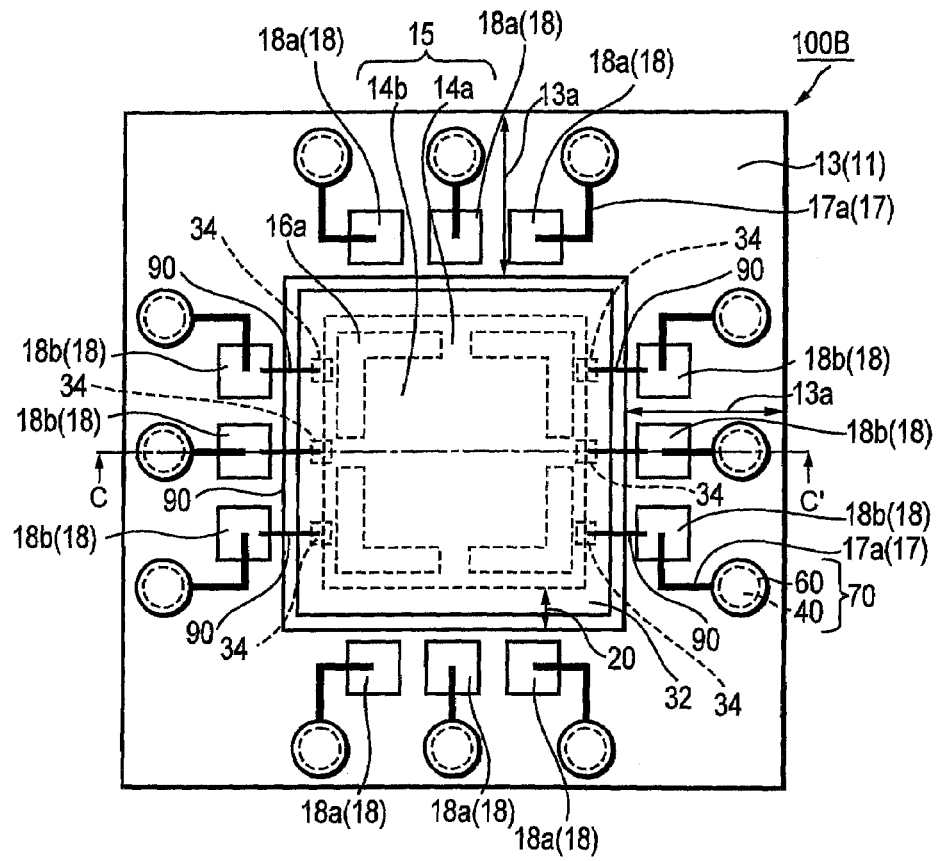
FIG. 10A is a schematic top view for describing an acceleration sensing device according to a second preferred embodiment of the present invention.
Figure 10B:
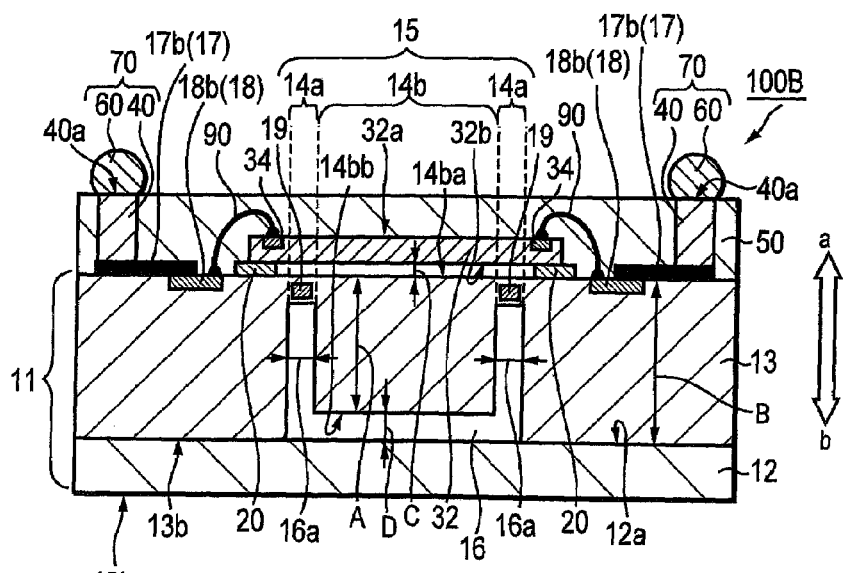
FIG. 10B is a schematic sectional view along a dashed line C-C' of the acceleration sensing device in FIG. 10A.

FIG. 10A is a schematic top view for describing an acceleration sensing device 100B according to a second preferred embodiment of the present invention. In FIG. 10A, an after-described sealing film is omitted so that internal configurations of the acceleration sensing device 100B can be shown. FIG. 10B is a schematic sectional view along a dashed line C-C' of the acceleration sensing device 100B in FIG. 10A. The acceleration sensing device 100B includes a semiconductor element 32 as the veiling member 30 according to the first preferred embodiment. Also, the acceleration sensing device 100B includes a plurality of thin metallic wires 90 which couple a plurality of internal electrodes 18 to a plurality of sensor controlling electrodes 34. The other configurations of the acceleration sensing device according to the second preferred embodiment are the substantially same as those according to the first preferred embodiment.

The acceleration sensing device 100B includes an acceleration sensing chip 11. The acceleration sensing chip 11 includes a frame member 13 and a movable structure 15. The frame member 13 configures an outline of the acceleration sensing chip 11 and includes a principal surface 13a and a rear surface 13b. The movable structure 15 includes a plurality of supporting members 14a and a movable sensing member 14b. The supporting members 14a are configured in one with the frame member 13 and the movable sensing member 14b. Each of the supporting members 14a extends between the movable sensing member 14b and an inside surface of the frame member 13. The movable sensing member 14b includes a principal surface 14ba which is substantially on the same level as an upper surface of the supporting members 14a and the principal surface 13a of the frame member 13. That is, the movable sensing member 14b is supported by the supporting members 14a, so that the principal surface 14ba of the movable sensing member 14b is coplanar with the principal surface 13a of the frame member 13. Furthermore, the movable sensing member 14b has a thickness "A" which is smaller than a thickness "B" of the frame member 13. That is, the movable sensing member 14b is supported in midair by the supporting members 14a. Also, the movable sensing member 14b is positioned away from the inside surface of the frame member 13 by a gap 16a of an opening 16 therebetween. Thus, the movable sensing member 14b can move along a direction indicated by an arrow "a" or "b" shown in FIG. 10B without contacting the frame member 13, in order to sense the acceleration. Each of the supporting members 14a internally includes a detecting element 19 which detects amount of displacement of the movable structure 15. Each of the detecting elements 19 is coupled to a wiring through which a detected signal by the detecting element 19 is transmitted or through which the detecting element 19 receives an input signal. In this example, the detecting element 19 is a piezoresistance element.

The acceleration sensing device 100B includes a covering member disposed on the frame member 13 so that the movable structure 15 is covered by the covering member. The covering member includes a supporting frame member 20 and the above-described semiconductor chip 32. The supporting frame member 20 is disposed on the principal surface 13a of the frame member 13 through adhesive material so as to surround the movable structure 15 and the opening 16. The semiconductor element 32 controls the operation of the acceleration sensing device 100B and also functions as a veiling member. The semiconductor chip 32 includes an upper surface 32a and a lower surface 32b which face each other. The semiconductor chip 32 includes a plurality of the sensor controlling electrodes 34 which are disposed on the upper surface 32a of the semiconductor chip 32. The sensor controlling electrodes 34 are arranged along a periphery of the upper surface 32a of the semiconductor chip 32. The lower surface 32b of the semiconductor chip 32 is joined over the supporting frame member 20 through adhesive material. The semiconductor chip 32 is disposed on the supporting frame member 20 so as to be positioned away from the principal surface 14ba of the movable sensing member 14b. That is, the supporting members 14a and the movable sensing member 14b are covered by the semiconductor chip 32 at a side of the principal surface 14ba of the movable sensing member 14b. The semiconductor chip 32 not only covers the movable structure 15 but also limits the movement of the movable structure 15 along the direction indicated by the arrow "a." That is, a clearance "C" between the principal surface 14ba of the movable sensing member 14b and the semiconductor chip 32 has to be determined so that the semiconductor chip 32 does not prevent the movement of the movable sensing member 14b in a measuring range of the envisioned acceleration. Therefore, the supporting frame member 20 needs to have a thickness which is equal to or larger than the clearance "C." An outline of the semiconductor chip 32 may be determined so as not to prevent the internal electrodes 18, interconnection films 17 and external electrodes 70 from being formed on the principal surface 13a of the frame member 13. The outline of the semiconductor chip 32 may be larger than an inner wall of the supporting frame member 20 and equal to or smaller than an outer wall of the supporting frame member 20.

The acceleration sensing device 100B includes a plurality of the internal electrodes 18, a plurality of the interconnection films 17, a sealing film 50 and a plurality of the external electrodes 70 disposed at the principal surface 13a of the frame member 13 and outside the supporting frame member 20. In general, the acceleration sensing device 100B has a passivation film which covers the principal surface 13a of the frame member 13. The passivation film may be an insulating film. The internal electrodes 18 are arranged around the covering member being exposed from the passivation film. The internal electrodes 18 include a plurality of first internal electrodes 18a and a plurality of second internal electrodes 18b. The first internal electrodes 18a are electrically coupled to the detecting elements 19 in the supporting members 14a through the above-described wirings. The second internal electrodes 18b may be electrically coupled to the detecting elements 19 in the supporting members 14a through the above-described wirings. Also, the second internal electrodes 18b are electrically coupled to the sensor controlling electrodes 34 of the semiconductor chip 32 through the thin metallic wires 90. The interconnection films 17 include a plurality of first interconnection films 17a and a plurality of second interconnection films 17b. The first and second interconnection films 17a and 17b are disposed on the principal surface 13a of the frame member 13. The first interconnection films 17a are electrically coupled to the first internal electrodes 18a and the second interconnection films 17b are electrically coupled to the second internal electrodes 18b. The first and second interconnection films 17a and 17b extend from the first internal electrodes 18a and the second internal electrodes 18b toward a periphery of the frame member 13. The external electrodes 70 are respectively disposed on the first and second interconnection films 17a and 17b. The external electrodes 70 are electrically coupled to the detecting elements 19 through the first interconnection films 17a, the first internal electrodes 18a and the wirings. Also, the external electrodes 70 are electrically coupled to the sensor controlling electrodes 34 of the semiconductor chip 32 through the second interconnection films 17b, the second internal electrodes 18b and the thin metallic wires 90. The external electrodes 70 include a plurality of conductive post members 40 and a plurality of solder bumps 60 disposed on top surfaces 40a of the conductive post members 40. The conductive post members 40 are electrically coupled to the first and second interconnection films 17a and 17b. The solder bumps 60 are electrically coupled to the conductive post members 40. Also, the external electrodes 70 are applicable to the acceleration sensing device 10 without the solder bumps 60, depending on variations of a mounting board on which the acceleration sensing device 10 is mounted. The sealing film 50 is disposed on the principal surface 13a of the frame member 13 so as to seal the supporting frame member 20, the semiconductor chip 32, the interconnection films 17 and the internal electrodes 18. In this example, a portion of each of the external electrodes 70, that is, each of the solder bumps 60 is exposed from the sealing film 50, and the conductive post members 40 are covered by the sealing film 50.

Furthermore, the acceleration sensing device 100B includes a sealing substrate 12 which is attached to the rear surface 13b of the frame member 13. The sealing substrate 12 has an upper surface 12a and a lower surface 12b which is opposite to the upper surface 12a. The sealing substrate 12 is attached to the frame member 13 so that the rear surface 13b of the frame member 13 faces the upper surface 12a of the sealing substrate 12. Thus, the movable sensing member 14b is covered by the sealing substrate 12. The sealing substrate 12 not only covers the movable structure 15 but also limits the movement of the movable structure 15 along the direction indicated by the arrow "b". That is, the sealing substrate 12 is positioned away from a bottom surface 14bb of the movable sensing member 14b with a clearance "D" between, and the clearance "D" may be determined so that the sealing substrate 12 does not prevent the movement of the movable sensing member 14b in the measuring range of the envisioned acceleration.

As described above, the acceleration sensing device 100B includes the covering member disposed on the principal surface 13a of the frame member 13 so that the movable sensing member 14b is covered by the covering member. Furthermore, the external electrodes 70 are electrically coupled to the internal electrodes 18 through the interconnection films 17 disposed on the principal surface 13a of the frame member 13, and the sealing film 50 is disposed on the principal surface 13a of the frame member 13 so as to seal the covering member, the interconnection films 17 and the internal electrodes 18. Therefore, the acceleration sensing device 10 may be miniaturized. Also, since the covering member includes the semiconductor chip 32 which controls the operation of the acceleration sensing device 100B, the function of the acceleration sensing device 100B may be advanced.

The operation of the above-described acceleration sensing device 100B is described below. The semiconductor chip 32 receives external signals through the second interconnection films 17b, the second internal electrodes 18b, the thin metallic films 90 and the sensor controlling electrodes 34. Then, the semiconductor chip 32 generates a control signal for the acceleration sensing chip 11, based on the external signals. While the acceleration sensing chip 11 is controlled by the control signal, the acceleration sensing device 100B senses the acceleration. When the movable sensing member 14b is displaced along the direction indicated by the arrow "a" or "b", the supporting members 14a which support the movable sensing member 14b are bent in accordance with the amounts of the displacement of the movable sensing member 14b. The amounts of the displacement are detected as variations of electrical resistance values, by the detecting elements 19 in the supporting members 14a. The detected variations of the electrical resistance values are transmitted to an external measurement circuit through the internal electrodes 18a, the interconnection films 17a and the external electrodes 70. As a result, the acceleration which is sensed by the movable sensing member 14b is quantitatively calculated.

Figure 11A:
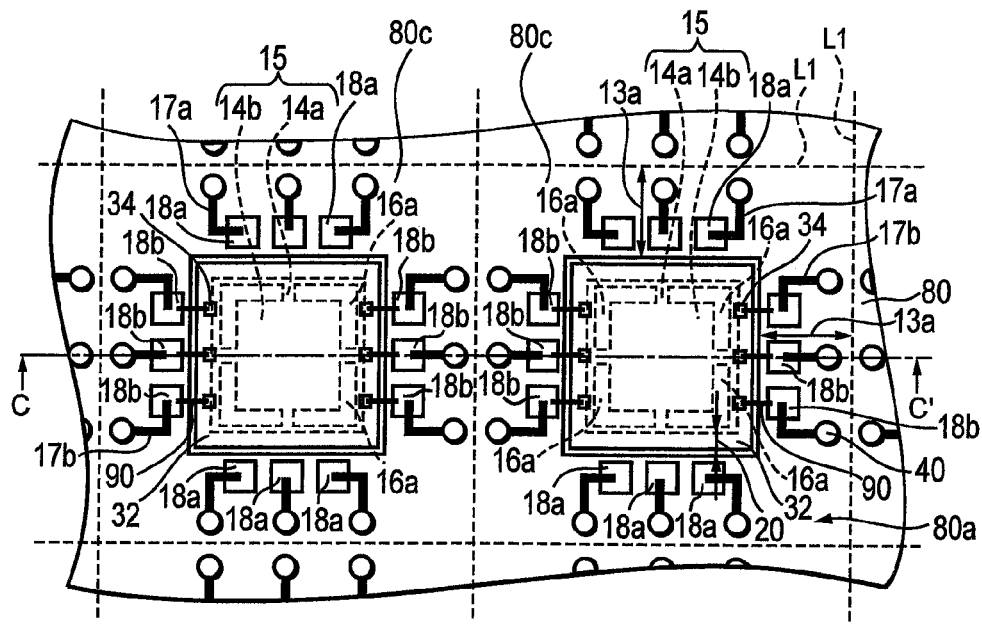
FIGS. 11A and 12A are schematic top views for describing processes of manufacturing the acceleration sensing device according to the second preferred embodiment of the present invention.
Figure 11B:
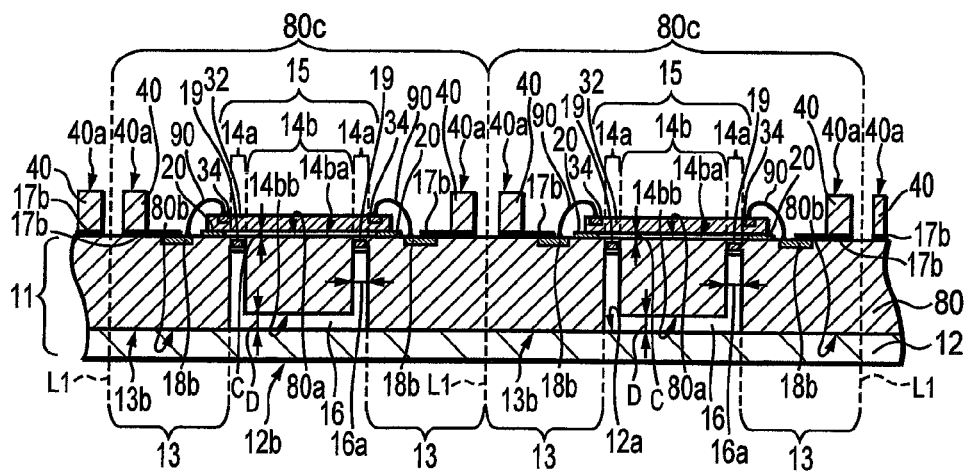
FIGS. 11B and 12B are schematic sectional views for describing processes of manufacturing the acceleration sensing device according to the second preferred embodiment of the present invention.
Figure 12A:
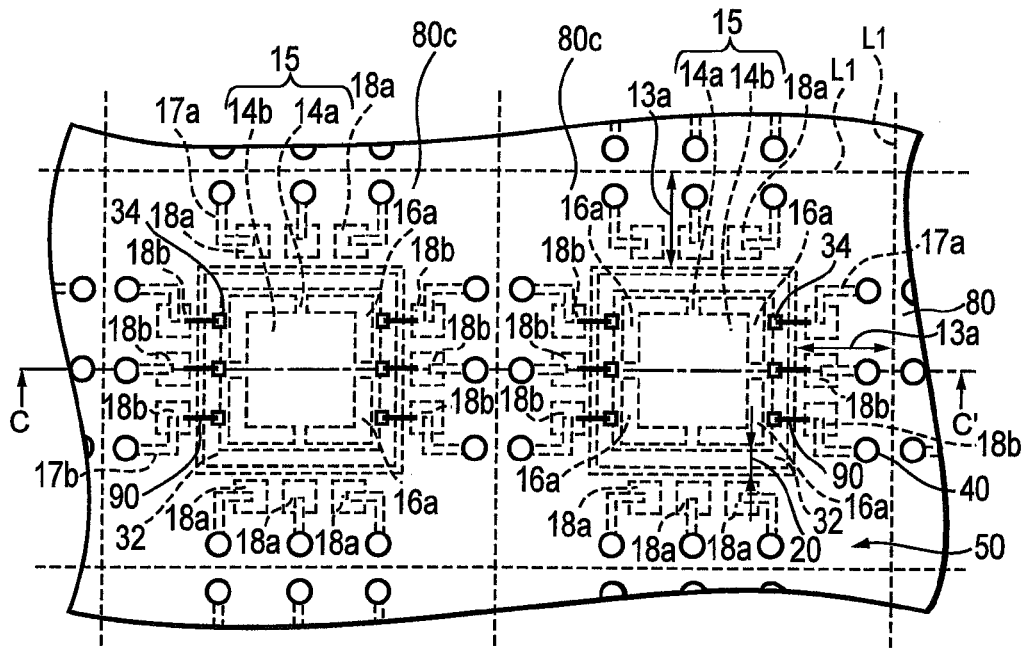
Figure 12B:
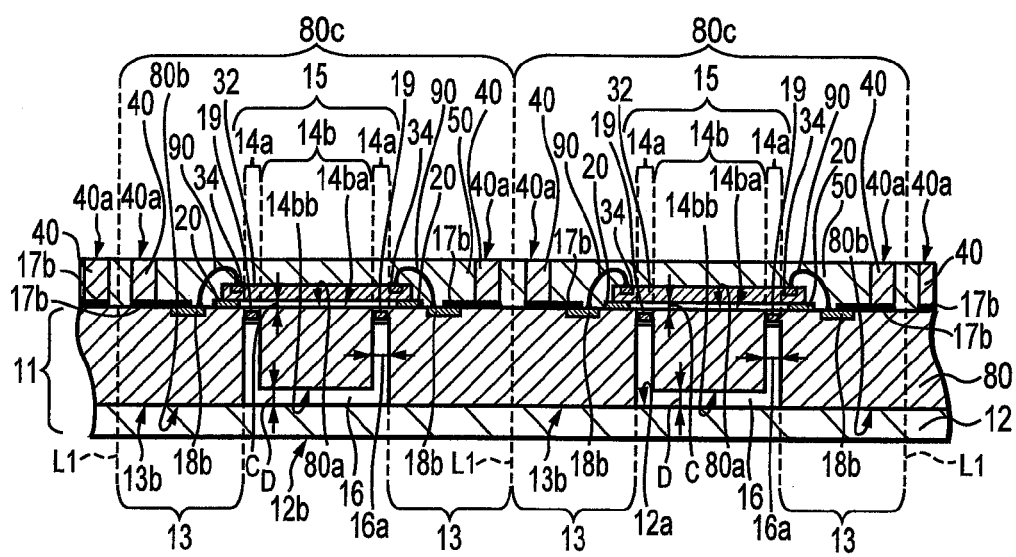

Next, the manufacturing method of the above-described acceleration sensing device 100B is described below. FIGS. 11A and 12A are schematic top views for describing processes of manufacturing the acceleration sensing device 100B according to the second preferred embodiment of the present invention. FIGS. 11B and 12B are schematic sectional views for describing processes of manufacturing the acceleration sensing device 100B according to the second preferred embodiment of the present invention. Each of FIGS. 11B and 12B is the schematic sectional view along a dashed line C-C' in each of FIGS. 11A and 12A.

First of all, the semiconductor substrate 80 is provided which includes a principal surface 80a and a rear surface 80b opposite to the principal surface 80a as well as in the first preferred embodiment. After the openings 16 are formed in the semiconductor substrate 80 by photolithography and etching methods in order to respectively configure the frame member 13 and the movable structures 15 in one in the device regions 80c of the semiconductor substrate 80 such as in the first preferred embodiment, the first internal electrodes 18a and the second internal electrodes 18b are formed in each of the device regions 80c so as to be arranged around the movable sensing member 14b as shown in FIG. 11A. The first internal electrodes 18a are arranged along sides of the movable sensing member 14b which face each other. Likewise, the second internal electrodes 18b are arranged along other sides of the movable sensing member 14b which face each other. The passivation film such as the insulating film is formed on the principal surface 80a of the semiconductor substrate 80 so as to cover the wirings and to expose the first and second internal electrodes 18a and 18b. Then, the sealing substrate 12 is attached onto the rear surface 80b of the semiconductor substrate 80 by an adhesive layer, so that the bottom surfaces 14bb of the movable sensing members 14b are covered by the sealing substrate 12 with the clearance "D" between, as shown in FIG. 11B.

Next, as shown in FIGS. 11A and 11B, a plurality of the first and second interconnection films 17a and 17b are formed in each of the device regions 80c of the semiconductor substrate 80 so as to extend from the first and second internal electrodes 18a and 18b toward a periphery of the device region 80c. That is, the first interconnection films 17a are formed so as to be electrically coupled to the first internal electrodes 18a, and the second interconnection films 17b are formed so as to be electrically coupled to the second internal electrodes 18b. Then, the conductive post members 40 are formed on the first and second interconnection films 17a and 17b as shown in FIGS. 11A and 11B. Next, the supporting frame members 20 are formed on the principal surface 80a of the semiconductor substrate 80 so that each of the movable structures 15 is surrounded by each of the supporting frame members 20. In addition, the supporting frame members 20 may be simultaneously formed together with the first and second interconnection films 17a and 17b. Thereafter, the semiconductor chips 32 are mounted on the supporting frame members 20 so that each of the movable structures 15 is covered by each of the semiconductor chips 32 as shown in FIGS. 11A and 11B. That is, each of the movable structures 15 is covered by the covering member which includes the supporting frame member 20 and the semiconductor chip 32. Also, the semiconductor chips 32 are mounted on the supporting frame members 20 so that the sensor controlling electrodes 34 face sides opposite to the movable structures 15. Then, the sensor controlling electrodes 34 are coupled to the second internal electrodes 18b by the thin metallic wires 90.

After the movable structures 15 are respectively covered by the covering members, the sealing film 50 is formed on the principal surface 80a of the semiconductor substrate 80 so as to cover the covering members, the first and second interconnection films 17a and 17b, the first and second internal electrodes 18a and 18b and a portion of each of the conductive post members 40, as shown in FIGS. 12A and 12B. That is, the sealing film 50 is formed so that top surfaces 40a of the conductive post members 40 are exposed from the sealing film 50. The sealing film 50 may be made of epoxy resin and formed by a transfer molding method or a printed method. Thereafter, a plurality of the solder bumps such as the solder bumps 60 in FIGS. 10A and 10B are formed on the top surfaces 40a of the conductive post members 40. The conductive post members 40 and the solder bumps 60 configure the external electrodes 70. Then, the sealing substrate 12 and the semiconductor substrate 80 covered by the sealing film 50 are divided into a plurality of the acceleration sensing devices along the lines L1, using a dicing apparatus, as well as according to the first preferred embodiment.

According to the second preferred embodiment, the movable sensing member is covered by the covering member that is formed on the frame member. Furthermore, the interconnection films which are coupled between the internal electrodes and the external electrodes are disposed on the frame member and are sealed by the sealing film. Therefore, the acceleration sensing device may be miniaturized. Also, since the covering member includes the semiconductor chip which controls the operation of the acceleration sensing device, the function of the acceleration sensing device may be advanced. Furthermore, after the semiconductor substrate in which the movable structures have been formed is sealed by the sealing film, the semiconductor substrate is divided into a plurality of the acceleration sensing devices. Therefore, waste materials of the semiconductor substrate, which are formed during the dicing process, may be suppressed from adhering to the movable sensing members. As a result, the yield percentage of the acceleration sensing devices may be improved.

Figure 13A:
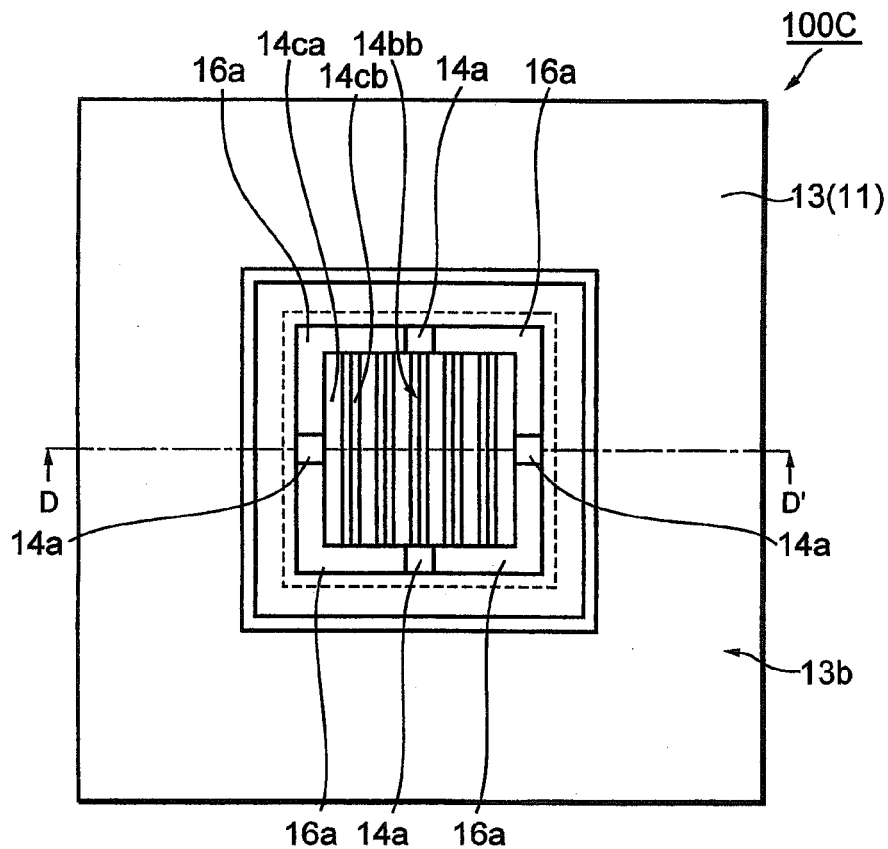
FIG. 13A is a schematic bottom view for describing an acceleration sensing device according to a third preferred embodiment of the present invention.
Figure 13B:
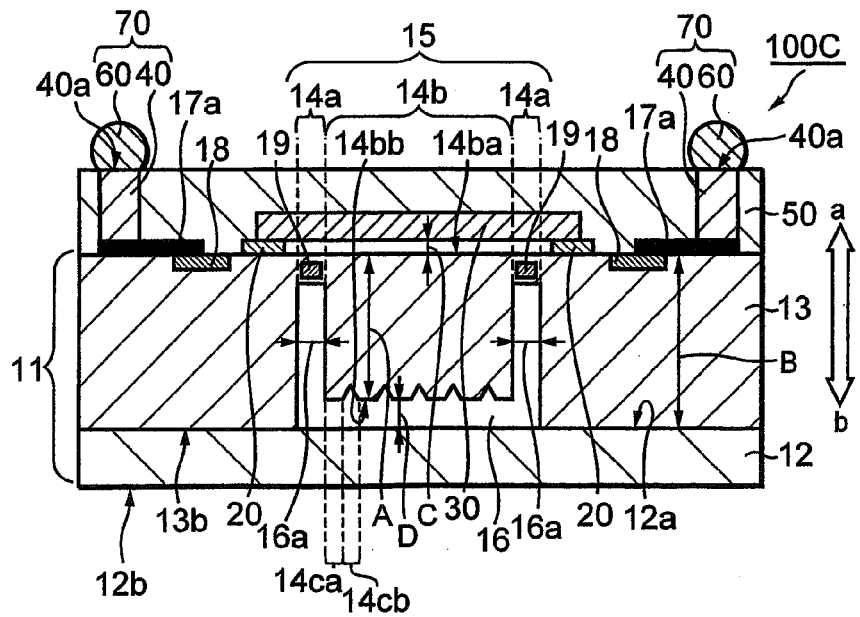
FIG. 13B is a schematic sectional view along a dashed line D-D' of the acceleration sensing device in FIG. 13A.

FIG. 13A is a schematic bottom view for describing an acceleration sensing device 100C according to a third preferred embodiment of the present invention. In FIG. 13A, an after-described sealing substrate is omitted so that internal configurations of the acceleration sensing device 100C can be shown. FIG. 13B is a schematic sectional view along a dashed line D-D' of the acceleration sensing device 100C in FIG. 13A. The acceleration sensing device 100C includes a plurality of grooves 14cb formed in the movable sensing member 14b. The other configurations of the acceleration sensing device according to the third preferred embodiment are the substantially same as those according to the first preferred embodiment.

The acceleration sensing device 100C includes an acceleration sensing chip 11. The acceleration sensing chip 11 includes a frame member 13 and a movable structure 15. The frame member 13 configures an outline of the acceleration sensing chip 11 and includes a principal surface 13a and a rear surface 13b. In this example, the outline of the acceleration sensing chip 11 is quadrangular. The movable structure 15 includes a plurality of supporting members 14a and a movable sensing member 14b. The supporting members 14a are configured in one with the frame member 13 and the movable sensing member 14b. Each of the supporting members 14a extends between the movable sensing member 14b and an inside surface of the frame member 13. Each of the supporting members 14a have a small thickness and a narrow width so as to bend when the movable sensing member 14b move to sense the acceleration. The movable sensing member 14b has a principal surface 14ba which is substantially on the same level as an upper surface of the supporting members 14a and the principal surface 13a of the frame member 13. That is, the movable sensing member 14b is supported by the supporting members 14a, so that the principal surface 14ba of the movable sensing member 14b is coplanar with the principal surface 13a of the frame member 13. Furthermore, the movable sensing member 14b has a thickness "A" which is smaller than a thickness "B" of the frame member 13. That is, the movable sensing member 14b is supported in midair by the supporting members 14a. Also, the movable sensing member 14b is positioned away from the inside surface of the frame member 13 by a gap 16a of an opening 16 therebetween. Thus, the movable sensing member 14b can move along a direction indicated by an arrow "a" or "b" shown in FIG. 13B without contacting the frame member 13, in order to sense the acceleration. In this example, the movable sensing member 14b is supported from four different sides by the four supporting members 14a. Alternatively, the movable sensing member 14b may be supported from only one side by one supporting member. Also, in this example, the movable sensing member 14b is cuboid. That is, the movable sensing member 14b has a quadrangle shape which is configured by four sides. The movable sensing member 14b is coupled to each of the supporting members 14a at a center portion of each of the four sides. Furthermore, the movable sensing member 14b includes a bottom surface 14bb opposite to the principal surface 14ba, and the bottom surface 14bb includes a plurality of the grooves 14cb and a plurality of planar areas 14ca. In this example, the grooves 14cb may be arranged in parallel to each other, and sectional shapes of the grooves 14cb may be triangular. Each of the supporting members 14a internally includes a detecting element 19 which detects amount of displacement of the movable structure 15. Each of the detecting elements 19 is coupled to a wiring through which a detected signal by the detecting element 19 is transmitted or through which the detecting element 19 receives an input signal. In this example, the detecting element 19 is a piezoresistance element.

The acceleration sensing device 100C includes a covering member disposed on the frame member 13 so that the movable structure 15 is covered by the covering member. The covering member includes a supporting frame member 20 and a veiling member 30. The supporting frame member 20 is disposed on the principal surface 13a of the frame member 13 so as to surround the movable structure 15 and the opening 16. The veiling member 30 is disposed on the supporting frame member 20 so as to be positioned away from the principal surface 14ba of the movable sensing member 14b. That is, the supporting members 14a and the movable sensing member 14b are covered by the veiling member 30 at a side of the principal surface 14ba of the movable sensing member 14b. The veiling member 30 not only covers the movable structure 15 but also limits the movement of the movable structure 15 along the direction indicated by the arrow "a." That is, a clearance "C" between the principal surface 14ba of the movable sensing member 14b and the veiling member 30 has to be determined so that the veiling member 30 does not prevent the movement of the movable sensing member 14b in a measuring range of the envisioned acceleration.

The acceleration sensing device 100C includes a plurality of the internal electrodes 18, a plurality of the interconnection films 17, a sealing film 50 and a plurality of the external electrodes 70 disposed at the principal surface 13a of the frame member 13 and outside the supporting frame member 20. The internal electrodes 18 are arranged around the covering member. The internal electrodes 18 are electrically coupled to the detecting elements 19 in the supporting members 14a. The interconnection films 17 are disposed on the principal surface 13a of the frame member 13 so as to be electrically coupled to the internal electrodes 18. The interconnection films 17 extend from the internal electrodes 18 toward a periphery of the frame member 13. The external electrodes 70 are respectively disposed on the interconnection films 17. The external electrodes 70 include a plurality of conductive post members 40 and a plurality of solder bumps 60 disposed on top surfaces 40a of the conductive post members 40. The conductive post members 40 are electrically coupled to the interconnection films 17. The solder bumps 60 are electrically coupled to the conductive post members 40. The sealing film 50 is disposed on the principal surface 13a of the frame member 13 so as to seal the supporting frame member 20, the veiling member 30, the interconnection films 17 and the internal electrodes 18. In this example, a portion of each of the external electrodes 70, that is, each of the solder bumps 60 is exposed from the sealing film 50, and the conductive post members 40 are covered by the sealing film 50.

Furthermore, the acceleration sensing device 100C includes a sealing substrate 12 which is attached to the rear surface 13b of the frame member 13. The sealing substrate 12 has an upper surface 12a and a lower surface 12b which is opposite to the upper surface 12a. The sealing substrate 12 is attached to the frame member 13 so that the rear surface 13b of the frame member 13 faces the upper surface 12a of the sealing substrate 12. Thus, the movable sensing member 14b is covered by the sealing substrate 12. The sealing substrate 12 not only covers the movable structure 15 but also controls the movement of the movable structure 15 along the direction indicated by the arrow "b". That is, the sealing substrate 12 is positioned away from the planar areas 14ca of the movable sensing member 14b with a clearance "D" between, and the clearance "D" may be determined so that the sealing substrate 12 does not prevent the movement of the movable sensing member 14b in the measuring range of the envisioned acceleration.

As described above, the acceleration sensing device 100C includes the covering member disposed on the principal surface 13a of the frame member 13 so that the movable sensing member 14b is covered by the covering member. Furthermore, the external electrodes 70 are electrically coupled to the internal electrodes 18 through the interconnection films 17 disposed on the principal surface 13a of the frame member 13, and the sealing film 50 is disposed on the principal surface 13a of the frame member 13 so as to seal the covering member, the interconnection films 17 and the internal electrodes 18. That is, the acceleration sensing device 30 is protected by the sealing film 50 without the bonding wires as described in the related art. Therefore, the acceleration sensing device 100C may be miniaturized. Also, the acceleration sensing device 100C includes a plurality of the grooves 14cb formed at the bottom surface 14bb of the movable sensing member 14b. When the movable sensing member 14b is displaced along the direction indicated by the arrow "b," the grooves 14cb suppress the bottom surface 14bb of the movable sensing member 14b from adhering to the sealing substrate 12. That is, the acceleration may be properly sensed because of the grooves 14cb. Furthermore, the smaller that planar areas 14ca of the bottom surface 14bb are, the more difficult it is for the sealing substrate 12 to adhere to the bottom surface 14bb of the movable sensing member 14b.

Next, the manufacturing method of the above-described acceleration sensing device 100C, in particular, the manufacturing method of the grooves 14cb is briefly described below.

First of all, the openings 16 are formed in the device regions 80c of the semiconductor substrate 80 in order to configure the supporting members 14a and the movable sensing members 14b, such as in the first preferred embodiment. Then, a plurality of the grooves 14cb are formed at each of the bottom surfaces 14bb of the movable sensing members 14b, using photolithography and etching methods. To be more precise, after a resist film is formed on each of the bottom surfaces 14bb of the movable sensing members 14b, the resist film is patterned by the photolithography method so that regions to become the grooves 14cb are exposed. In this example, the resist film is patterned to include a stripe geometry. That is, the resist film is patterned to include a plurality of linear openings which respectively have the same widths and which are arranged in parallel to each other. Then, the bottom surfaces 14bb of the movable sensing members 14b which are exposed from the linear openings are removed by the etching method in order to form the grooves 14cb. After the patterned resist film is removed, the sealing substrate 12 is attached onto the rear surface 80b of the semiconductor substrate 80, so that the bottom surfaces 14bb of the movable sensing members 14b are covered by the sealing substrate 12 with the clearance "D" between. Thereafter, the covering member, the internal electrodes 18, the interconnection films 17, the sealing film 50 and the external electrodes 70 are formed on the semiconductor substrate 80. Then, the sealing substrate 12 and the semiconductor substrate 80 covered by the sealing film 50 are divided into a plurality of the acceleration sensing devices along the lines L1, using a dicing apparatus. That is, the semiconductor substrate 80 is divided in accordance with each of the device regions 80c.

According to the third preferred embodiment, the movable sensing member is covered by the covering member that is formed on the frame member. Furthermore, the interconnection films which are coupled between the internal electrodes and the external electrodes are disposed on the frame member and are sealed by the sealing film. Therefore, the acceleration sensing device may be miniaturized. Also, the acceleration sensing device includes a plurality of the grooves formed at the bottom surface of the movable sensing member. Therefore, the bottom surface of the movable sensing member is suppressed from adhering to the sealing substrate. That is, the acceleration may be properly sensed because of the grooves 14cb.

Furthermore, after the semiconductor substrate in which the movable structures have been formed is sealed by the sealing film, the semiconductor substrate is divided into a plurality of the acceleration sensing devices. Therefore, waste materials of the semiconductor substrate, which are formed during the dicing process, may be suppressed from adhering to the movable sensing members. As a result, the yield percentage of the acceleration sensing devices may be improved.

Figure 14A:
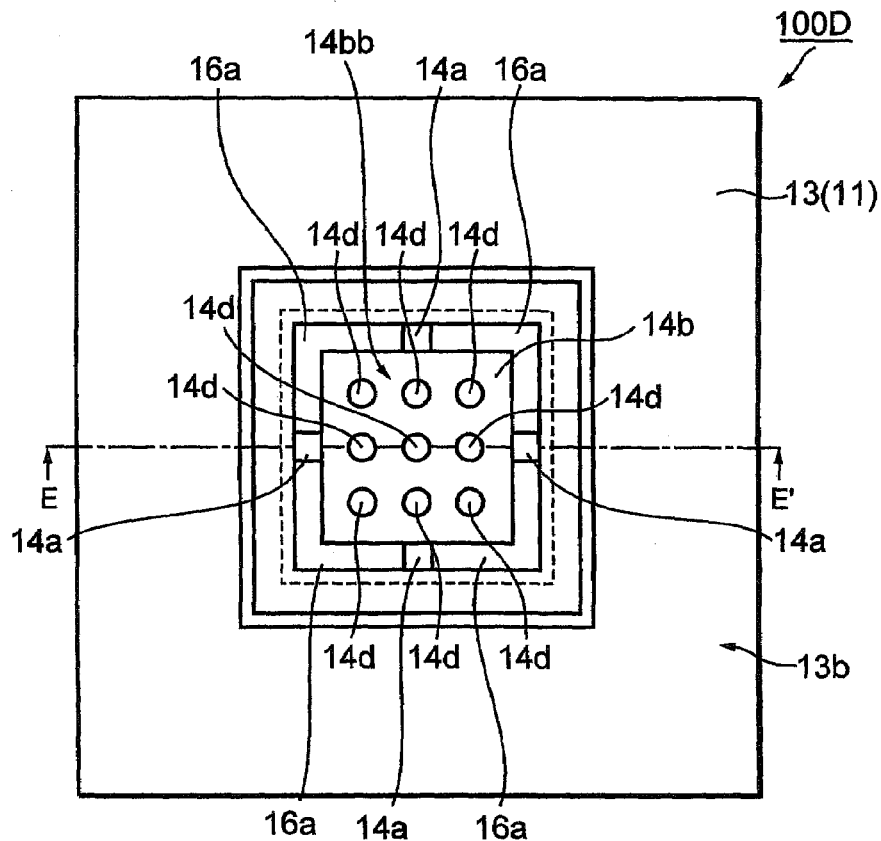
FIG. 14A is a schematic bottom view for describing an acceleration sensing device according to a fourth preferred embodiment of the present invention.
Figure 14B:
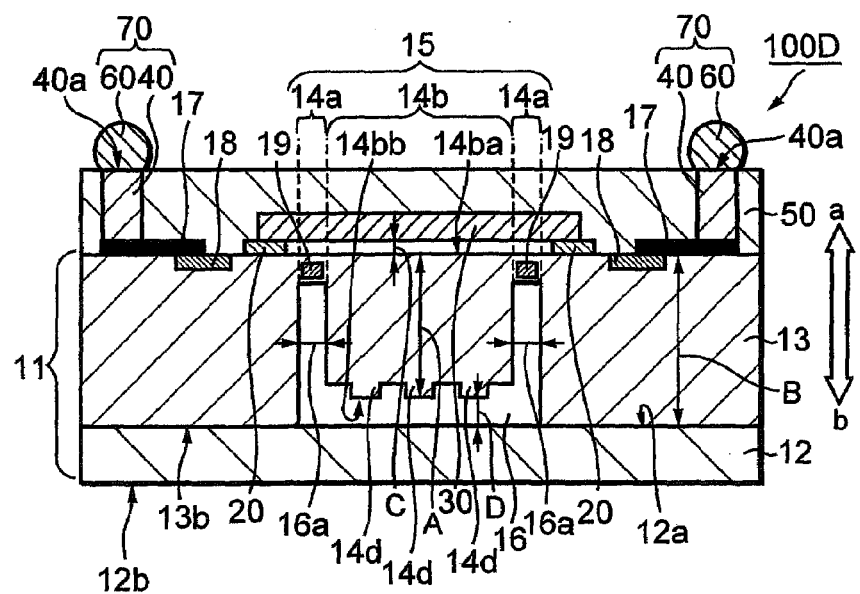
FIG. 14B is a schematic sectional view along a dashed line E-E' of the acceleration sensing device in FIG. 14A.

FIG. 14A is a schematic bottom view for describing an acceleration sensing device 100D according to a fourth preferred embodiment of the present invention. In FIG. 14A, an after-described sealing substrate is omitted so that internal configurations of the acceleration sensing device 100D can be shown. FIG. 14B is a schematic sectional view along a dashed line E-E' of the acceleration sensing device 100D in FIG. 14A. The acceleration sensing device 100D includes a plurality of protrusions 14d formed in the movable sensing member 14b. The other configurations of the acceleration sensing device according to the fourth preferred embodiment are the substantially same as those according to the first preferred embodiment.

The acceleration sensing device 100D includes an acceleration sensing chip 11. The acceleration sensing chip 11 includes a frame member 13 and a movable structure 15. The frame member 13 configures an outline of the acceleration sensing chip 11 and includes a principal surface 13a and a rear surface 13b. In this example, the outline of the acceleration sensing chip 11 is quadrangular. The movable structure 15 includes a plurality of supporting members 14a and a movable sensing member 14b. The supporting members 14a are configured in one with the frame member 13 and the movable sensing member 14b. Each of the supporting members 14a extends between the movable sensing member 14b and an inside surface of the frame member 13. Each of the supporting members 14a has a thin thickness and a narrow width so as to bend when the movable sensing member 14b moves to sense acceleration. The movable sensing member 14b has a principal surface 14ba which is substantially on the same level as an upper surface of the supporting members 14a and the principal surface 13a of the frame member 13. That is, the movable sensing member 14b is supported by the supporting members 14a, so that the principal surface 14ba of the movable sensing member 14b is coplanar with the principal surface 13a of the frame member 13. Furthermore, the movable sensing member 14b has a thickness "A" which is smaller than a thickness "B" of the frame member 13. That is, the movable sensing member 14b is supported in midair by the supporting members 14a. Also, the movable sensing member 14b is positioned away from the inside surface of the frame member 13 with a gap 16a of an opening 16 between. Thus, the movable sensing member 14b can move along a direction indicated by an arrow "a" or "b" shown in FIG. 14B without contacting the frame member 13, in order to sense the acceleration. In this example, the movable sensing member 14b is supported from four different sides by the four supporting members 14a. Also, in this example, the movable sensing member 14b is cuboid. That is, the movable sensing member 14b has a quadrangle shape which is configured by four sides. The movable sensing member 14b is coupled to each of the supporting members 14a at a center portion of each of the four sides. Furthermore, the movable sensing member 14b includes a bottom surface 14bb opposite to the principal surface 14ba, and the bottom surface 14bb includes a plurality of the protrusions 14d. In this example, nine protrusions 14d are arranged in a reticular pattern and placed evenly spaced apart. Each of the supporting members 14a internally includes a detecting element 19 which detects amount of displacement of the movable structure 15. Each of the detecting elements 19 is coupled to a wiring through which a detected signal by the detecting element 19 is transmitted or through which the detecting element 19 receives an input signal. In this example, the detecting element 19 is a piezoresistance element.

The acceleration sensing device 100D includes a covering member disposed on the frame member 13 so that the movable structure 15 is covered by the covering member. The covering member includes a supporting frame member 20 and a veiling member 30. The supporting frame member 20 is disposed on the principal surface 13a of the frame member 13 so as to surround the movable structure 15 and the opening 16. The veiling member 30 is disposed on the supporting frame member 20 so as to be positioned away from the principal surface 14ba of the movable sensing member 14b. That is, the supporting members 14a and the movable sensing member 14b are covered by the veiling member 30 at a side of the principal surface 14ba of the movable sensing member 14b. The veiling member 30 not only covers the movable structure 15 but also limits the movement of the movable structure 15 along the direction indicated by the arrow "a." That is, a clearance "C" between the principal surface 14ba of the movable sensing member 14b and the veiling member 30 has to be determined so that the veiling member 30 does not prevent the movement of the movable sensing member 14b in a measuring range of the envisioned acceleration.

The acceleration sensing device 100D includes a plurality of the internal electrodes 18, a plurality of the interconnection films 17, a sealing film 50 and a plurality of the external electrodes 70 disposed at the principal surface 13a of the frame member 13 and outside the supporting frame member 20. The internal electrodes 18 are arranged around the covering member. The internal electrodes 18 are electrically coupled to the detecting elements 19 in the supporting members 14a. The interconnection films 17 are disposed on the principal surface 13a of the frame member 13 so as to be electrically coupled to the internal electrodes 18. The interconnection films 17 extend from the internal electrodes 18 toward a periphery of the frame member 13. The external electrodes 70 are respectively disposed on the interconnection films 17. The external electrodes 70 include a plurality of conductive post members 40 and a plurality of solder bumps 60 disposed on top surfaces 40a of the conductive post members 40. The conductive post members 40 are electrically coupled to the interconnection films 17. The solder bumps 60 are electrically coupled to the conductive post members 40. The sealing film 50 is disposed on the principal surface 13a of the frame member 13 so as to seal the supporting frame member 20, the veiling member 30, the interconnection films 17 and the internal electrodes 18. In this example, a portion of each of the external electrodes 70, that is, each of the solder bumps 60 is exposed from the sealing film 50, and the conductive post members 40 are covered by the sealing film 50.

Furthermore, the acceleration sensing device 100D includes a sealing substrate 12 which is attached to the rear surface 13b of the frame member 13. The sealing substrate 12 has an upper surface 12a and a lower surface 12b which is opposite to the upper surface 12a. The sealing substrate 12 is attached to the frame member 13 so that the rear surface 13b of the frame member 13 faces the upper surface 12a of the sealing substrate 12. Thus, the movable sensing member 14b is covered by the sealing substrate 12. The sealing substrate 12 not only covers the movable structure 15 but also controls the movement of the movable structure 15 along the direction indicated by the arrow "b". That is, the sealing substrate 12 is positioned away from top surfaces of the protrusions 14d of the movable sensing member 14b with a clearance "D" between, and the clearance "D" may be determined so that the sealing substrate 12 does not prevent the movement of the movable sensing member 14b in the measuring range of the envisioned acceleration.

As described above, the acceleration sensing device 100D includes the covering member disposed on the principal surface 13a of the frame member 13 so that the movable sensing member 14b is covered by the covering member. Furthermore, the external electrodes 70 are electrically coupled to the internal electrodes 18 through the interconnection films 17 disposed on the principal surface 13a of the frame member 13, and the sealing film 50 is disposed on the principal surface 13a of the frame member 13 so as to seal the covering member, the interconnection films 17 and the internal electrodes 18. That is, the acceleration sensing device 40 is protected by the sealing film 50 without the bonding wires as described in the related art. Therefore, the acceleration sensing device 100D may be miniaturized. Also, the acceleration sensing device 100D includes a plurality of the protrusions 14d formed at the bottom surface 14bb of the movable sensing member 14b. When the movable sensing member 14b is displaced along the direction indicated by the arrow "b," the protrusions 14d suppress the bottom surface 14bb of the movable sensing member 14b from adhering to the sealing substrate 12. That is, the acceleration may be properly sensed because of the protrusions 14d.

Next, the manufacturing method of the above-described acceleration sensing device 100D, in particular, the manufacturing method of the protrusions 14d is briefly described below.

First of all, the openings 16 are formed in the device regions 80c of the semiconductor substrate 80 in order to configure the supporting members 14a and the movable sensing members 14b, such as in the first preferred embodiment. Then, a plurality of the protrusions 14d are formed at each of the bottom surfaces 14bb of the movable sensing members 14b, using photolithography and etching methods. To be more precise, after a resist film is formed on each of the bottom surfaces 14bb of the movable sensing members 14b, the resist film is patterned by the photolithography method so that regions to become the protrusions 14d are covered. In this example, the resist film is patterned to include a polka-dot pattern. That is, a plurality of resist patterns which are columnar are formed on the bottom surfaces 14bb. Then, the bottom surfaces 14bb of the movable sensing members 14b are etched using the resist patterns as masks, in order to form the protrusions 14d.

After the patterned resist film is removed, the sealing substrate 12 is attached onto the rear surface 80b of the semiconductor substrate 80, so that the bottom surfaces 14bb of the movable sensing members 14b are covered by the sealing substrate 12 with the clearance "D" between. Thereafter, the covering member, the internal electrodes 18, the interconnection films 17, the sealing film 50 and the external electrodes 70 are formed on the semiconductor substrate 80. Then, the sealing substrate 12 and the semiconductor substrate 80 covered by the sealing film 50 are divided into a plurality of the acceleration sensing devices along the lines L1, using a dicing apparatus. That is, the semiconductor substrate 80 is divided in accordance with each of the device regions 80c.

According to the fourth preferred embodiment, the movable sensing member is covered by the covering member that is formed on the frame member. Furthermore, the interconnection films which are coupled between the internal electrodes and the external electrodes are disposed on the frame member and are sealed by the sealing film. Therefore, the acceleration sensing device may be miniaturized. Also, the acceleration sensing device includes a plurality of the protrusions formed at the bottom surface of the movable sensing member. Therefore, the bottom surface of the movable sensing member is suppressed from adhering to the sealing substrate. That is, the acceleration may be properly sensed because of the protrusions.

Furthermore, after the semiconductor substrate in which the movable structures have been formed is sealed by the sealing film, the semiconductor substrate is divided into a plurality of the acceleration sensing devices. Therefore, waste materials of the semiconductor substrate, which are formed during the dicing process, may be suppressed from adhering to the movable sensing members. As a result, the yield percentage of the acceleration sensing devices may be improved.

Figure 15A:
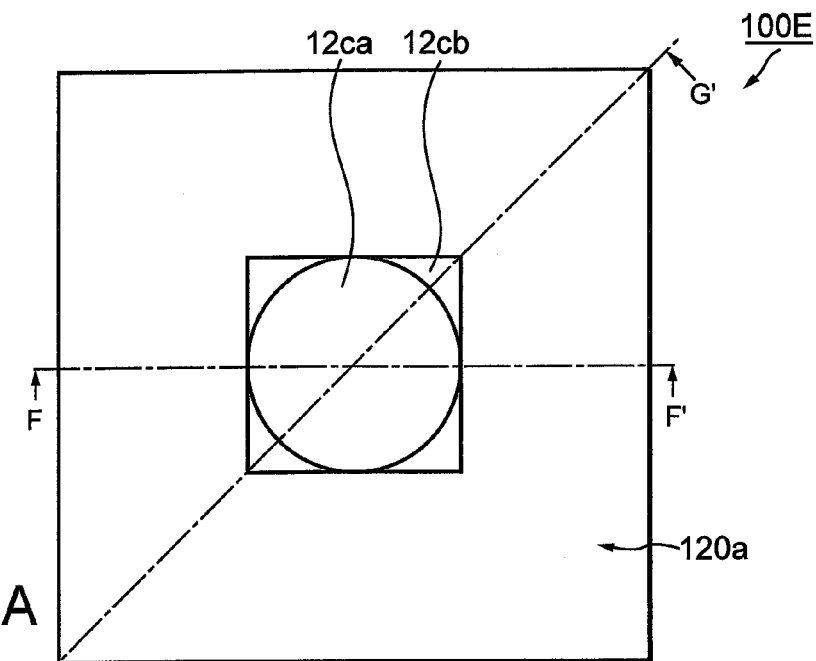
FIG. 15A is a schematic top view for describing a sealing substrate of an acceleration sensing device according to a fifth preferred embodiment of the present invention.
Figure 15B:
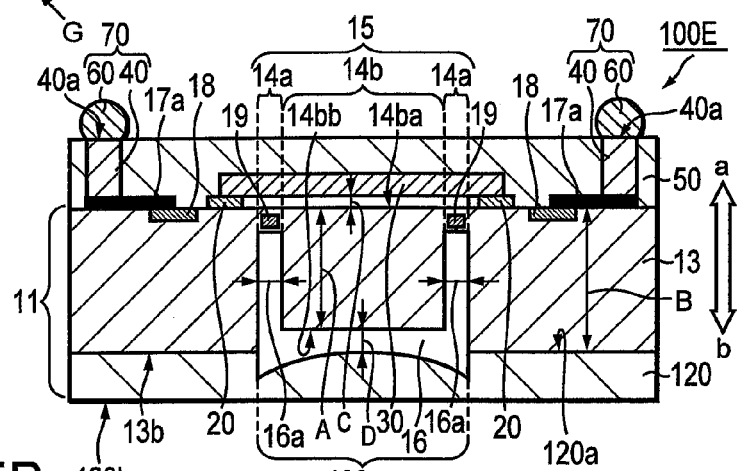
FIG. 15B is a schematic sectional view along a dashed line F-F' of the acceleration sensing device in FIG. 15A.
Figure 15C:
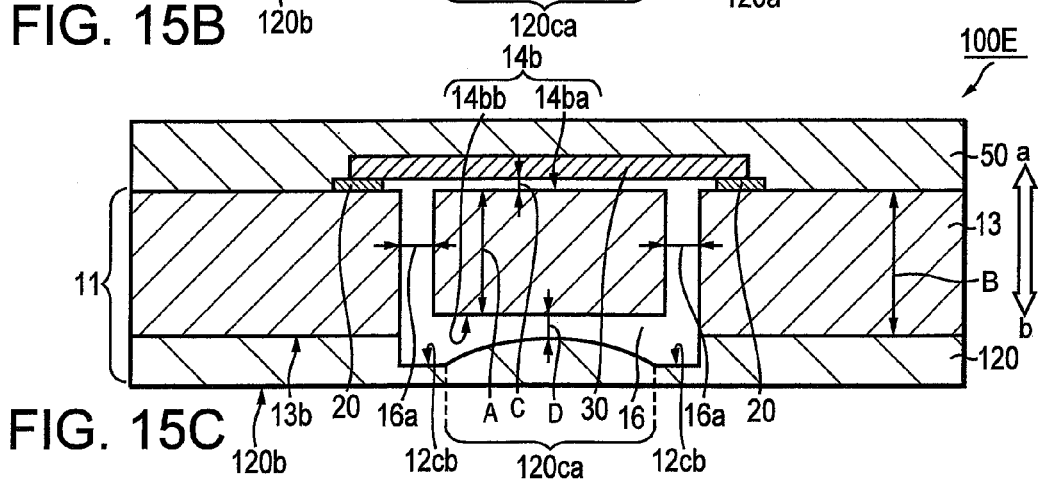
FIG. 15C is a schematic sectional view along a dashed line G-G' of the acceleration sensing device in FIG. 15A.

FIG. 15A is a schematic top view for describing a sealing substrate 120 of an acceleration sensing device 100E according to a fifth preferred embodiment of the present invention. In FIG. 15A, the acceleration sensing chip 11 is omitted so that the structure of the sealing substrate 120 can be mainly shown. FIG. 15B is a schematic sectional view along a dashed line F-F' of the acceleration sensing device 100E in FIG. 15A. FIG. 15C is a schematic sectional view along a dashed line G-G' of the acceleration sensing device 100E in FIG. 15A. The acceleration sensing device 100E includes a projecting portion formed in the sealing substrate 120. The other configurations of the acceleration sensing device according to the fifth preferred embodiment are the substantially same as those according to the first preferred embodiment.

The acceleration sensing device 100E includes an acceleration sensing chip 11. The acceleration sensing chip 11 includes a frame member 13 and a movable structure 15. The frame member 13 configures an outline of the acceleration sensing chip 11 and includes a principal surface 13a and a rear surface 13b. In this example, the outline of the acceleration sensing chip 11 is quadrangular. The movable structure 15 includes a plurality of supporting members 14a and a movable sensing member 14b. The supporting members 14a are configured in one with the frame member 13 and the movable sensing member 14b. Each of the supporting members 14a extends between the movable sensing member 14b and an inside surface of the frame member 13. Each of the supporting members 14a has a thin thickness and a narrow width so as to bend when the movable sensing member 14b moves to sense acceleration. The movable sensing member 14b has a principal surface 14ba which is substantially on the same level as an upper surface of the supporting members 14a and the principal surface 13a of the frame member 13. That is, the movable sensing member 14b is supported by the supporting members 14a, so that the principal surface 14ba of the movable sensing member 14b is coplanar with the principal surface 13a of the frame member 13. Furthermore, the movable sensing member 14b has a thickness "A" which is smaller than a thickness "B" of the frame member 13. That is, the movable sensing member 14b is supported in midair by the supporting members 14a. Also, the movable sensing member 14b is positioned away from the inside surface of the frame member 13 with a gap 16a of an opening 16 between. Thus, the movable sensing member 14b can move along a direction indicated by an arrow "a" or "b" shown in FIGS. 15B and 15C without contacting the frame member 13, in order to sense the acceleration. In this example, the movable sensing member 14b is supported from four different sides by the four supporting members 14a. Also, in this example, the movable sensing member 14b is cuboid. That is, the movable sensing member 14b has a quadrangle shape which is configured by four sides. The movable sensing member 14b is coupled to each of the supporting members 14a at a center portion of each of the four sides. Each of the supporting members 14a internally includes a detecting element 19 which detects amount of displacement of the movable structure 15. Each of the detecting elements 19 is coupled to a wiring through which a detected signal by the detecting element 19 is transmitted or through which the detecting element 19 receives an input signal. In this example, the detecting element 19 is a piezoresistance element.

The acceleration sensing device 100E includes a covering member disposed on the frame member 13 so that the movable structure 15 is covered by the covering member. The covering member includes a supporting frame member 20 and a veiling member 30. The supporting frame member 20 is disposed on the principal surface 13a of the frame member 13 so as to surround the movable structure 15 and the opening 16. The veiling member 30 is disposed on the supporting frame member 20 so as to be positioned away from the principal surface 14ba of the movable sensing member 14b. That is, the supporting members 14a and the movable sensing member 14b are covered by the veiling member 30 at a side of the principal surface 14ba of the movable sensing member 14b. The veiling member 30 not only covers the movable structure 15 but also controls the movement of the movable structure 15 along the direction indicated by the arrow "a." That is, a clearance "C" between the principal surface 14ba of the movable sensing member 14b and the veiling member 30 has to be determined so that the veiling member 30 does not prevent the movement of the movable sensing member 14b in a measuring range of the envisioned acceleration.

The acceleration sensing device 100E includes a plurality of the internal electrodes 18, a plurality of the interconnection films 17, a sealing film 50 and a plurality of the external electrodes 70 disposed at the principal surface 13a of the frame member 13 and outside the supporting frame member 20. The internal electrodes 18 are arranged around the covering member. The internal electrodes 18 are electrically coupled to the detecting elements 19 in the supporting members 14a. The interconnection films 17 are disposed on the principal surface 13a of the frame member 13 so as to be electrically coupled to the internal electrodes 18. The interconnection films 17 extend from the internal electrodes 18 toward a periphery of the frame member 13. The external electrodes 70 are respectively disposed on the interconnection films 17. The external electrodes 70 include a plurality of conductive post members 40 and a plurality of solder bumps 60 disposed on top surfaces 40a of the conductive post members 40. The conductive post members 40 are electrically coupled to the interconnection films 17. The solder bumps 60 are electrically coupled to the conductive post members 40. The sealing film 50 is disposed on the principal surface 13a of the frame member 13 so as to seal the supporting frame member 20, the veiling member 30, the interconnection films 17 and the internal electrodes 18. In this example, a portion of each of the external electrodes 70, that is, each of the solder bumps 60 is exposed from the sealing film 50, and the conductive post members 40 are covered by the sealing film 50.

Furthermore, the acceleration sensing device 100E includes the sealing substrate 120 which is attached to the rear surface 13b of the frame member 13. The sealing substrate 120 has an upper surface 120a and a lower surface 120b which is opposite to the upper surface 120a. The sealing substrate 120 is attached to the frame member 13 so that the rear surface 13b of the frame member 13 faces the upper surface 120a of the sealing substrate 120. Thus, the movable sensing member 14b is covered by the sealing substrate 120. The upper surface 120a includes a concave portion 120cb which faces a bottom surface 14bb of the movable sensing member 14b. The sealing substrate 120 includes the projecting portion 120ca formed in the concave portion 120cb. An area of a bottom surface in the concave portion 120cb may be larger than an area of the bottom surface 14bb of the movable sensing member 14b. That is, an outline of the bottom surface in the concave portion 120cb may surround an outline of the bottom surface 14bb of the movable sensing member 14b. The projecting portion 120ca includes a spherical surface. A top of the projecting portion 120ca may face a center portion of the bottom surface 14bb of the movable sensing member 14b. Also, in this example, the top of the projecting portion 120ca may be substantially on the same level as the upper surface 120a of the sealing substrate 120. The sealing substrate 120 not only covers the movable structure 15 but also limits the movement of the movable structure 15 along the direction indicated by the arrow "b". Accordingly, the top of the projecting portion 120ca has to be positioned away from a bottom surface 14bb of the movable sensing member 14b with a clearance "D" between, and the clearance "D" may be determined so that the projecting portion 120ca of the sealing substrate 120 does not prevent the movement of the movable sensing member 14b in the measuring range of the envisioned acceleration.

As described above, the acceleration sensing device 100E includes the covering member disposed on the principal surface 13a of the frame member 13 so that the movable sensing member 14b is covered by the covering member. Furthermore, the external electrodes 70 are electrically coupled to the internal electrodes 18 through the interconnection films 17 disposed on the principal surface 13a of the frame member 13, and the sealing film 50 is disposed on the principal surface 13a of the frame member 13 so as to seal the covering member, the interconnection films 17 and the internal electrodes 18. That is, the acceleration sensing device 100E is protected by the sealing film 50 without the bonding wires as described in the related art. Therefore, the acceleration sensing device 100E may be miniaturized. Also, the acceleration sensing device 100E includes the sealing substrate 120 in which the projecting portion 120ca is formed. The projecting portion 120ca faces the bottom surface 14bb of the movable sensing member 14b. When the movable sensing member 14b is displaced along the direction indicated by the arrow "b," the projecting portion 120ca suppresses the bottom surface 14bb of the movable sensing member 14b from adhering to the sealing substrate 120. That is, the acceleration may be properly sensed because of the projecting portion 120ca.

Next, the manufacturing method of the above-described acceleration sensing device 100E, in particular, the manufacturing method of the projecting portion 120ca of the sealing substrate 120 is briefly described below.

First of all, the openings 16 are formed in the device regions 80c of the semiconductor substrate 80 in order to configure the supporting members 14a and the movable sensing members 14b, such as in the first preferred embodiment. On the other hand, after the sealing substrate 120 which may be a glass substrate is provided, the projecting portions 120ca and the concave portions 120cb are formed in the upper surface 120a of the sealing substrate 120 by photolithography and etching methods. Alternatively, after resist materials provided on the upper surface 120a of the sealing substrate 120 are hardened, the sealing substrate 120 may be etched by sputtering using the hardened resist materials as masks. As a result, the projecting portions 120ca may be formed in the regions in which the resist materials are provided and the concave portions 120cb may be formed in the other regions.

After the projecting portions 120ca have been formed, the sealing substrate 120 is attached onto the rear surface 80b of the semiconductor substrate 80, so that the projecting portions 120ca faces the bottom surfaces 14bb of the movable sensing members 14b with the clearance "D" between. Thereafter, the covering member, the internal electrodes 18, the interconnection films 17, the sealing film 50 and the external electrodes 70 are formed on the semiconductor substrate 80. Then, the sealing substrate 120 and the semiconductor substrate 80 covered by the sealing film 50 are divided into a plurality of the acceleration sensing devices along the lines L1, using a dicing apparatus. That is, the semiconductor substrate 80 is divided in accordance with each of the device regions 80c.

According to the fifth preferred embodiment, the movable sensing member is covered by the covering member that is formed on the frame member. Furthermore, the interconnection films which are coupled between the internal electrodes and the external electrodes are disposed on the frame member and are sealed by the sealing film. Therefore, the acceleration sensing device may be miniaturized. Also, the acceleration sensing device includes the sealing substrate in which the projecting portion is formed. Therefore, the bottom surface of the movable sensing member is suppressed from adhering to the sealing substrate. That is, the acceleration may be properly sensed because of the projecting portion.

Furthermore, after the semiconductor substrate in which the movable structures have been formed is sealed by the sealing film, the semiconductor substrate is divided into a plurality of the acceleration sensing devices. Therefore, waste materials of the semiconductor substrate, which are formed during the dicing process, may be suppressed from adhering to the movable sensing members. As a result, the yield percentage of the acceleration sensing devices may be improved.

What is claimed is:

1. An acceleration sensing device, comprising:
 a movable sensing member having a principal surface and a first thickness, wherein the movable sensing member senses acceleration;
 a frame member having a principal surface and a second thickness which is greater than the first thickness, wherein the frame member surrounds the movable sensing member;
 a supporting member coupled between the movable sensing member and the frame member, wherein the supporting member supports the movable sensing member so that the principal surface of the movable sensing member is coplanar with the principal surface of the frame member;
 a covering member disposed above the movable sensing member, with a gap between the covering member and the movable sensing member;
 a plurality of internal electrodes disposed at the principal surface of the frame member, wherein the internal electrodes are arranged around the covering member;
 a plurality of interconnection films disposed on the principal surface of the frame member so as to be coupled to the internal electrodes;
 a plurality of external electrodes disposed over the interconnection films, wherein the external electrodes are electrically coupled to the interconnection films; and
 a resin film disposed on the principal surface of the frame member so as to seal the covering member, the internal electrodes and the interconnection films.

2. The acceleration sensing device according to claim 1, wherein the covering member comprises:
 a supporting frame member disposed on the frame member so as to surround the movable sensing member; and
 a veiling member disposed on the supporting frame member so as to cover the movable sensing member.

3. The acceleration sensing device according to claim 2, wherein the supporting frame member surrounds the supporting member.

4. The acceleration sensing device according to claim 2, wherein the veiling member includes a semiconductor element which controls operation of the acceleration sensing device.

5. The acceleration sensing device according to claim 4, wherein the semiconductor element has a plurality of sensor controlling electrodes thereon, the acceleration sensing device further comprising:
 a plurality of bonding wires which couple the sensor controlling electrodes with the internal electrodes, wherein the bonding wires are covered with the resin film.

6. The acceleration sensing device according to claim 1, wherein the supporting member includes a detecting element which detects displacement of the movable sensing member.

7. The acceleration sensing device according to claim 6, wherein the detecting element is electrically coupled to one of the internal electrodes.

8. The acceleration sensing device according to claim 6, wherein the detecting element is a piezoresistance element.

9. The acceleration sensing device according to claim 1, further comprising:
 a plurality of conductive post members disposed on the interconnection films, wherein the conductive post members are electrically coupled to the interconnection films and the external electrodes.

10. The acceleration sensing device according to claim 9, wherein the conductive post members are covered with the resin film.

11. The acceleration sensing device according to claim 1, wherein the movable sensing member has a rear surface opposite to the principal surface thereof, and wherein the rear surface of the movable sensing member includes a plurality of grooves.

12. The acceleration sensing device according to claim 11, wherein the grooves are arranged in parallel.

13. The acceleration sensing device according to claim 1, wherein the movable sensing member has a rear surface opposite to the principal surface thereof, and wherein the rear surface of the movable sensing member includes a plurality of protrusions.

14. The acceleration sensing device according to claim 1, further comprising:
    a base substrate disposed on a rear surface of the frame member opposite to the principal surface of the frame member, so as to cover the movable sensing member, wherein the base substrate has a projecting portion which faces the movable sensing member.

15. The acceleration sensing device according to claim 14, wherein the projecting portion has a spherical surface.

* * * * *